United States Patent [19]

Kurimoto

[11] Patent Number: 5,405,787
[45] Date of Patent: Apr. 11, 1995

[54] STRUCTURE AND METHOD OF MANUFACTURE FOR MOS FIELD EFFECT TRANSISTOR HAVING LIGHTLY DOPED DRAIN AND SOURCE DIFFUSION REGIONS

[75] Inventor: Kazumi Kurimoto, Osaka, Japan

[73] Assignee: Matsushita Electric Industrial Co., Ltd., Osaka, Japan

[21] Appl. No.: 135,649

[22] Filed: Oct. 14, 1993

Related U.S. Application Data

[62] Division of Ser. No. 977,462, Nov. 17, 1992, Pat. No. 5,306,655, which is a division of Ser. No. 735,237, Jul. 24, 1991, abandoned.

[30] Foreign Application Priority Data

Jul. 24, 1990 [JP] Japan .................................. 2-196621

[51] Int. Cl.⁶ ..................... H01L 21/265; H01L 21/00
[52] U.S. Cl. ......................................... 437/28; 437/29; 437/35; 437/44; 437/80
[58] Field of Search ......................... 437/27, 28, 29, 35, 437/36, 30, 80; 148/DIG. 143

[56] References Cited

U.S. PATENT DOCUMENTS 4,558,338 12/1985 Sakata .................................. 437/36
5,286,665 2/1994 Muragishi et al. ..................... 437/35

FOREIGN PATENT DOCUMENTS 63-44768 2/1988 Japan .
2-34936 2/1990 Japan .

OTHER PUBLICATIONS

"A Novel Submicron LDD Transistor With Inverse T-Gate Structure", Huang et al., IEDM 1986.
"Design and Characteristics of the Lightly Doped Drain-Source (LDD) Insulated Gate Field-Effect Transistor" Ogura et al., Transactions on Electron Devices, vol. ED-27, No. 8, Aug. 1980, pp. 1359-1367.

*Primary Examiner*—Olik Chaudhuri
*Assistant Examiner*—Brian Dutton
*Attorney, Agent, or Firm*—Lowe, Price, LeBlanc & Becker

[57] ABSTRACT

Structures and methods of manufacture are described for a MOS FET that is suitable for extreme miniaturization, of a type in which lightly doped drain and source diffusion regions are formed respectively adjoining the conventional highly doped drain and source diffusion regions in the semiconductor substrate surface, for reducing electric field concentration in the drain region. The underside of the gate electrode of the FET is formed with a downwardly protruding convex shape, so that a thick region of gate insulation film is positioned between the drain diffusion regions and the most closely adjacent part of the gate electrode, whereby gate-to-drain stray capacitance and the vertical component of electric field within the lightly doped drain diffusion region are reduced. The underside of the gate electrode can be formed in the required shape by various methods which effectively utilize self alignment and are easily adapted to currently used types of LSI manufacturing process.

5 Claims, 16 Drawing Sheets

STRUCTURE AND METHOD OF MANUFACTURE FOR MOS FIELD EFFECT TRANSISTOR HAVING LIGHTLY DOPED DRAIN AND SOURCE DIFFUSION REGIONS

This application is a division of application Ser. No. 07/977,462, filed Nov. 17, 1992, now U.S. Pat. No. 5,306,655, which is a divisional of application Ser. No. 07/735,237, filed Jul. 24, 1991, now abandoned.

BACKGROUND OF THE INVENTION

1. Field of the Invention

The present invention relates to a metal-oxide semiconductor field effect transistor which can be made extremely small in size and is suitable for application to LSI (large-scale integration) circuit technology, and related to methods of manufacturing such a transistor.

2. Field of the Invention

In order to produce metal-oxide semiconductor field effect transistors (abbreviated in the following to MOS FETs) which are extremely small in size and hence have a very short channel length, it is necessary to adopt countermeasures against various problems which arise as a result of the size reduction, and in particular as a result of channel length reduction. One of these problems is that during operation with a voltage applied to the gate electrode, a very high concentration of electric field is produced within the transistor at the drain pinchoff region. This results in hot-electron emission in that region, which causes problems including degradation of the current drive capability of the transistor, etc. For brevity of description, an NPN MOS transistor configuration will be assumed in the following, although the remarks are equally applicable to a PNP transistor. In the conventional form of such a transistor, the drain and source regions are formed as respective highly doped n-type regions in a p-type semiconductor substrate. Proposals have been made in the prior art for reducing the aforementioned problems which result from MOS FET miniaturization, by forming respective lightly doped n-type source and drain diffusion regions which adjoin the actual (i.e. highly doped) source and drain diffusion regions and which extend into the channel region. In this way the high electric field that is developed in the drain diffusion region of a conventional MOS FET can be spread into the lightly doped n-type diffusion region, and hence the peak value of that electric field is reduced, so that the problems described above can be alleviated. A prior art example of such a structure, called the LDD (lightly doped drain) MOS FET, is described in the IEEE Transactions on Electron Devices, Vol. ED-27, No. 8, August 1980, pages 1359 to 1367. Another prior art example of such a structure is the Inverse-T Gate structure MOS FET (referred to in the following as the inverse-TMOS FET) which is described in the IEDM Technical Digest, 1986, pages 742 to 745.

FIGS. 1 and 2 are respective cross-sectional views of the LDD transistor and the Inverse-TMOS transistor. As used herein, the term "Cross-sectional view" of a MOS FET structure refers to a cross-section which is perpendicular to the substrate major planes, and passes centrally through the drain and source diffusion regions. In each of FIGS. 1 and 2, numeral 1 denotes a p-type Si substrate, 2 denotes an electrically insulating film, and 3 denotes highly doped n-type diffusion regions which constitute the drain and source diffusion regions. (It will be assumed that each of the various MOS FET structures described herein is symmetrical, so that for example either of the regions 3 shown in FIG. 1 could function as the drain diffusion region.) Numeral 4 denotes respective lightly doped n-type diffusion regions formed in the semiconductor substrate 1, each of which extends from one of the highly doped n-type diffusion regions 3, into the channel region as shown.

With the prior art LDD MOS FET of FIG. 1, when a high voltage is applied between the source and drain diffusion regions (i.e. each formed of one of the regions 3 together with one region 4), the depletion layer will extend through the regions 4, so that the peak value of the high electric field in the drain region will be reduced, and hence an improvement can be achieved with regard to hot-electron emission and resultant degradation of transistor performance.

With the prior art Inverse-TMOS transistor shown in FIG. 2, when a high voltage is applied between the source and drain diffusion regions, similar effects are obtained to those described above for the LDD transistor, although the Inverse-TMOS structure is described as providing an even greater improvement than is provided by the LDD structure. In addition, the shape of the gate electrode 5a of the Inverse-TMOS structure enables parasitic resistance due to depletion within the n-type lightly doped drain diffusion region 4 to be suppressed.

With such a prior art type of LDD or Inverse-TMOS FET, when a voltage is applied to the gate electrode 5a, a current can flow between the highly doped n-type drain and source diffusion regions 3, whereas when no voltage is applied to the gate electrode 5a, no current can flow between the drain and source diffusion regions. Thus such a device can operate as a MOS FET switch.

However with the prior art LDD MOS FET of FIG. 1, the following problems arise:

(1) Referring to FIG. 3, FIG. 3(a) is a partial cross-sectional view of the LDD MOS FET of FIG. 1, focussed on the drain diffusion region, while FIG. 3(b) is a diagram in which distances along the horizontal axis corresponds to those of FIG 3(a) and which shows the distribution of electric field in the structure of FIG. 3(a). When a high voltage is applied between the source and drain diffusion regions 3, then due to the fact that the gate electrode 5a is coupled through a very thin layer of the oxide film to the lightly doped drain diffusion region 4 as shown in FIG. 3(a), a high value of electric field is produced within that diffusion region 4 at a position immediately below the outer end of the gate electrode 5a, due to the vertical and horizontal components of the electric field at that position. That very high level of electric field causes hot-electron emission, resulting in various problems as described hereinabove.

(2) Due to the position at which that very high value of electric field is produced, i.e. immediately adjacent to the outer end of the gate electrode 5a, the hot electrons will be readily trapped in the thick side wall formed of oxide film which covers that end portion of the gate electrode. This trapping of hot electrons results in a substantial increase in the rate of degradation of the transistor.

(3) Since depletion will readily occur within the lightly doped diffusion region 4, this constitutes a source of parasitic resistance.

Referring to FIG. 4, FIG. 4(a) is a partial cross-sectional view of the prior art Inverse-TMOS FET Of FIG. 2, focussed on the drain diffusion region, while FIG. 4(b) is a diagram in which distances along the horizontal axis corresponds to those of FIG. 4(a) and which shows the distribution of electric field in the structure of FIG. 4(a). With such a structure, the following problems arise:

(1) Due to the fact that the lightly doped drain diffusion region 4 is completely covered by the gate electrode 5a, while separated therefrom by a thin oxide film, the stray capacitance between drain and gate is high, which results in problems such as increased delay time and increased power consumption.

(2) As shown in the electric field FIG. 4(b), the vertical component of electric field within the lightly doped drain diffusion region 4 is increased due to the action of the gate electrode 5a, and when a voltage is applied to the gate electrode 5a for setting the transistor in the OFF state, with a high voltage bring applied to the drain diffusion region, then inter-band tunnelling will occur, which results in a drain leakage current, i.e. resulting in gate diode leakage being produced.

Thus, both of these prior art types of MOS FET which attempt to prevent deterioration of performance in spite of miniaturization of the MOS FET structure, by the addition of lightly doped n-type diffusion regions at the drain and source diffusion regions, have respective disadvantages.

SUMMARY OF THE INVENTION

It is a basic objective of the present invention to overcome the disadvantages of the prior art type of MOS FET which utilizes lightly doped diffusion regions at the drain and source regions as described hereinabove, by providing a structure and method of manufacture for an insulated-gate MOS FET which incorporates such lightly doped diffusion regions but wherein the amount of gate-to-drain stray capacitance is kept small, and which reduces the degree to which a high value of electric field is produced Within the lightly doped diffusion region at the drain of the transistor, so that the problems which arise with the prior art structures with respect to gate diode leakage current, degradation of current drive capability due to hot-electron emission, etc. can be substantially reduced, and whereby a highly miniaturized insulated-gate MOS FET structure can be provided which is suitable for high-density LSI applications and whose drive current capabilities are not substantially lowered as a result of device miniaturization.

To achieve the above Objectives, according to a first aspect, the present :invention provides a metaloxide semiconductor field effect transistor, comprising:

a semiconductor substrate of a first conduction type, having formed in a major surface thereof highly doped drain and source diffusion regions, and lightly doped drain and source diffusion regions disposed mutually opposing and respectively adjoining said highly doped drain and source diffusion regions, each of said diffusion regions being of a second conduction type;

a gate insulating layer formed on said major face of said semiconductor substrate; and a gate electrode formed on said gate insulating layer, said gate electrode having an underside formed in a downwardly protruding convex shape, with first and second outer parts of said underside disposed immediately above said lightly doped drain and source diffusion regions respectively, separated therefrom by respective thick regions of said gate insulating layer.

According to a second aspect, the present invention provides a field effect transistor wherein the gate electrode is formed of first and second layers of materials having first and second values of work function respectively, said first layer including said outer parts of the gate electrode underside, said second layer including all of said underside other than said outer parts, and wherein said second work function value is smaller than said first work function value if the semiconductor substrate of the transistors is p-type, and is larger than the first work function value if the substrate is n-type.

According to a third aspect, the present invention provides a method of manufacturing a metal-oxide semiconductor field effect transistor comprising successively executed steps of:

(a) sequentially forming upon a major face of a semiconductor substrate that is of a first conduction type a first insulating film, a conducting film for use in forming a gate electrode, formed over said first insulating film, and a second insulating film formed over said conducting film;

(b) forming a mask by photolithography and executing anisotropic etching using the mask, to a depth sufficient to selectively expose said first insulating film, to form a a portion of said conducting film as a gate electrode, with a portion of said second insulating film covering only a top face of said gate electrode;

(c) forming over said gate electrode, said second insulating film portion thereon, and adjoining regions of said first insulating film, a third insulating film consisting of a material which is not readily permeable to oxygen;

(d) executing anisotropic etching to selectively remove said third insulating film, leaving said third insulating film only upon side faces of said gate electrode and of said second insulating film portion;

(e) executing ion implantation to form first and second highly doped diffusion regions of a second conduction type within said major face of the semiconductor substrate;

(f) executing oxidation processing to oxidize outer end portions of an underside of said gate electrode, while side faces of said gate electrode extending above said end portions are protected from oxidation by said third insulating film, to thereby form thick oxide insulating film regions between said outer end portions of the gate electrode underside and said major face of the semiconductor substrate; and (g) executing large tilt angle ion implantation to form, in said major face of the semiconductor substrate, first and second lightly doped diffusion regions of said second conduction type, respectively adjoining said first and second highly doped diffusion regions, with said said lightly doped diffusion regions extending below respective ones of .said thick oxide insulating film regions.

According to a fourth aspect, the present invention provides a method of manufacturing a metal-oxide semiconductor field effect transistor comprising successively executed steps of:

(a) forming upon a major face of a semiconductor substrate that is of a first conduction type a first insulating film and forming upon said first insulating film a second insulating film;

(b) forming a patterned mask by photolithography at predetermined positions on the second insulating film, and executing strongly anisotropic etching through the mask in the vertical direction to a sufficient depth to expose the first insulating film, for thereby forming an opening in the second insulating film;

(c) forming over regions including said opening in the second insulating film an upper film having an etching ratio that is different from those of said first and second insulating films;

(d) executing strongly anisotropic etching in the vertical direction to remove said upper film from positions other than side faces of said second insulating film;

(e) executing strongly anisotropic etching in the vertical direction of the first insulating film using said second insulating film and said upper film as a mask, to thereby form an opening in said first insulating film which is concentric with and smaller than said opening in the second insulating film;

(f) executing oxidation of a region including said opening in the second insulating film, to form a thin region of the first insulating film on said substrate main face within said opening in the first insulating film;

(g) filling said apertures in the first and second insulating films with a conducting material to form a gate electrode;

(h) executing etching to completely remove said second insulating film;

(i) executing large slant angle ion implantation to form lightly doped first and second diffusion regions of a second conduction type, mutually opposing within said main face of the semiconductor substrate, said first and second lightly doped diffusion regions each extending to respective positions below said thin region of the first insulating film;

(j) forming a third insulating film over a region including said gate electrode;

(k) executing strongly anisotropic etching in the vertical direction of the third insulating film, leaving the third insulating film remaining only on side faces of said gate electrode; and (l) executing ion implantation into said main face of the semiconductor substrate, to form first and second highly doped diffusion regions of the second conduction type, respectively adjoining said first and second lightly doped diffusion regions.

According to a fifth aspect, the present invention provides a method of manufacturing a metal-oxide semiconductor field effect transistor comprising successively executed steps of:

(a) forming upon a major face of a semiconductor substrate that is of a first conduction type a first insulating film, and successively forming upon said first insulating film as a multilayer set of films a first conducting film and a second conducting film, said second conducting film having an etching ratio that is different from said first conducting film;

(b) etching said multilayer set of films at predetermined positions using a photolithography mask, to a depth sufficient to expose said first insulating film, by anisotropic etching, to form a gate electrode from said mutlilayer set of films;

(c) etching mutually opposing end portions of said first conducting film of said gate electrode, while leaving said second conducting film of the gate electrode unchanged, to thereby form an underside of said gate electrode to a downwardly protruding convex shape, as seen in cross-sectional view;

(d) executing large slant angle ion implantation to form first and second lightly doped diffusion regions of a second conduction type in said major face of the semiconductor substrate, such that said diffusion regions extend to respective positions below said first conducting film of the gate electrode;

(e) executing fellow thermal processing to form a second insulating film of a material suitable for fellow processing, over a region including said gate electrode, with said second insulating film being formed to a greater thickness over said first insulating film than over a top face of said gate electrode;

(f) forming a third insulating film over a region including said gate electrode;

(g) executing etching to remove said third insulating film from all regions other than side portions of said second insulating film which cover side faces of said gate electrode, using strongly anisotropic etching in the vertical direction;

(h) executing ion implantation to form first and second highly doped diffusion regions of the second conduction type, respectively adjoining said first and second lightly doped diffusion regions, in said major face of the semiconductor substrate.

According to a sixth aspect, the invention provides a method of manufacturing a metal-oxide semiconductor field effect transistor comprising successively executed steps of:

(a) forming upon a major face of a semiconductor substrate that is of a first conduction type a first insulating film, and successively forming upon said first insulating film as a multilayer set of films a first conducting film and a second conducting film, with said second conducting film being formed of a material that is not readily oxidized;

(b) etching said multilayer set of films at predetermined positions using a photolithography mask and a strongly anisotropic etching method, to a depth sufficient to expose said first insulating film, to form a gate electrode from said mutlilayer get of films;

(c) executing large slant angle ion implantation to form first and second lightly doped diffusion regions of a second conduction type in said major face of the semiconductor substrate, such that said diffusion regions extend to respective positions below said first conducting film of the gate electrode;

(d) executing oxidation processing to oxidize opposing end portions of said first conducting film of the gate electrode while leaving said second conducting film unchange, to thereby form said gate electrode with an underside having a downwardly protruding convex shape;

(e) forming a second insulating film over a region including said gate electrode;

(f) executing strongly anisotropic etching in the vertical direction, to remove said second insulating film from all regions other than side faces of said gate electrode;

(g) executing ion implantation to form first and second highly doped diffusion regions of the second conduction type, respectively adjoining said first and second lightly doped diffusion regions, in said major face of the semiconductor substrate.

With a device structure and method of manufacture for a MOS FET according to the present invention, the following advantages are obtained:

(1) Due to the fact that the underside of the gate electrode of the transistor is formed in a downwardly-protruding convex shape, a reduction can be achieved in the amount of stray capacitance between the drain and gate electrode which arises due to portions of the gate electrode being disposed closely adjacent to the lightly doped drain diffusion region, since the part of the gate electrode that is most closely adjacent to that lightly doped diffusion region is separated therefrom by a thick insulating film. Moreover, the presence of that think insulating film between the lightly doped drain diffusion region and the most closely adjacent part of the gate electrode serves to reduce the value of the vertical component of electric field which is produced within that lightly doped diffusion region, and to reduce energy band curvature, thereby reducing the concentration of electric field within the lightly doped drain diffusion region.

(2) In the case of an embodiment of the present invention in which the upper side of the gate electrode is formed in an upwardly, protruding convex shape, a greater amount of separation is provided between the gate electrode and any connecting lines which are formed above the gate electrode, thereby serving to reduce the amount of stray lead capacitance.

(3) In the case of an embodiment of the present invention in which the portions of the gate electrode that are disposed closely adjacent to the lightly doped source and drain diffusion regions are formed of a material having a higher value of work function than that of a downwardly protruding portion of the gate electrode, in the case of a p-type semiconductor substrate, or are formed of a material having a lower value of work function than that of the downwardly protruding portion of the gate electrode, in the case of an n-type semiconductor substrate being used, the effective level of voltage applied from the gate electrode to the lightly doped source and drain diffusion regions is effectively reduced, so that the concentration of electric field in the drain region can be reduced.

(4) Currently used types of LSI manufacturing process can be easily adapted for manufacturing MOS FETs according to the present invention, for example by successively:

forming an insulating film on the side walls of a gate electrode formed on a semiconductor substrate, the insulating film consisting of a material which is not readily permeable to oxygen;

oxiding opposing portions of the gate electrode which are disposed immediately adjacent to the substrate surface, while preventing oxidation of other parts of the sides of the gate electrode, thereby forming the underside of the gate electrode to a downwardly protruding convex shape; and executing ion implantation using a large tilt angle to form lightly doped diffusion regions beneath respective thick oxide film portions that are formed at the drain and source sides of the transistor, below the underside of the gate electrode.

DESCRIPTION OF PREFERRED EMBODIMENTS

A first embodiment of a transistor structure according to the present invention will be described, having the basic objective of providing a MOS FET in which the amount of stray capacitance between drain and gate is small, and in which the level of electric field in the vicinity of a lightly doped drain diffusion region is held low, to thereby overcome problems such as gate diode leakage current and drive current level degradation.

Figure 5:
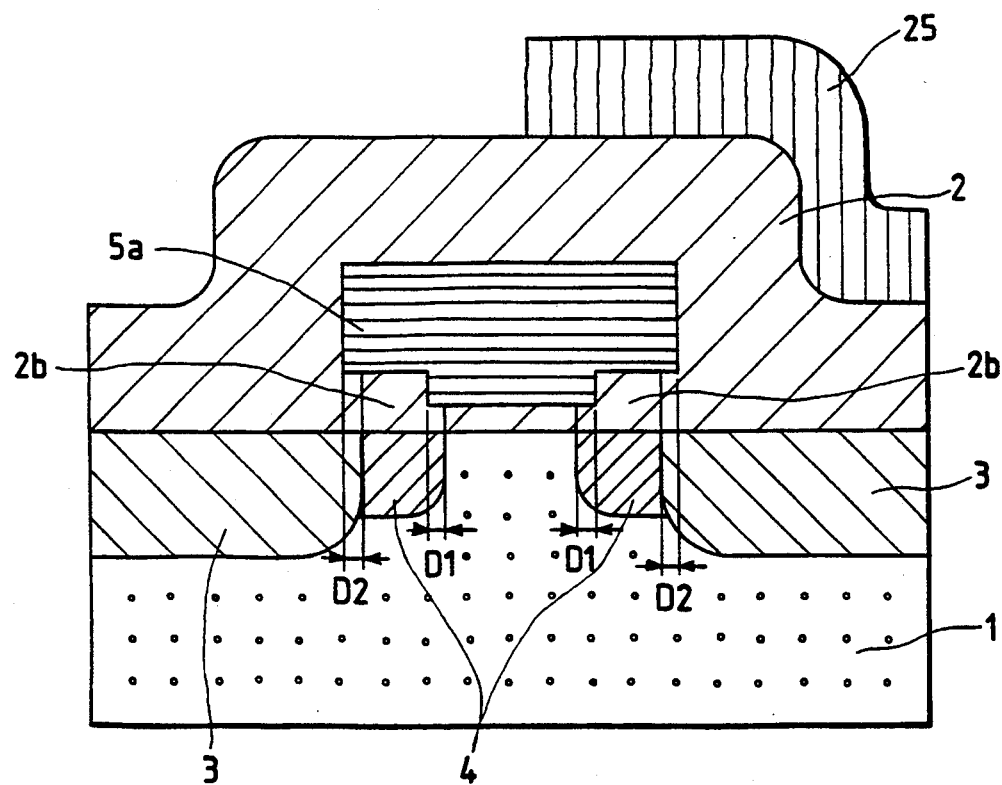
FIG. 5 is a cross-sectional view of a first embodiment of a MOS FET according to the present invention.

FIG. 5 is a cross-sectional view of the first embodiment of a MOS FET, in which numeral 1 denotes a p-type Si substrate, 2 denotes an insulating film, 3 denotes highly doped n-type drain, and source diffusion regions (n+ regions), and 4 denotes lightly doped n-type drain and source diffusion regions (n− regions) for reducing the electric field concentration in the vicinity of the drain region, 5a denotes a gate electrode having the underside thereof formed with a downwardly protruding convex shape, and formed of a material such as Si, polysilicon, tungsten, etc. It should be noted that the term "convex" as used herein signifies a surface shape having a centrally located outwardly protruding region, and is used irrespective of whether the transition from a peripheral region of the surface to that outwardly protruding central region is a gradual or a stepwise transition. In addition, the terms "conducting" and "insulating" as used herein are to be understood as respectively signifying "electrically conducting" and "electrically insulating", while "horizontal direction" is used to signify a direction parallel to the substrate major faces, and "vertical direction" a direction perpendicular to these major faces. Numeral 25 denotes a connecting line formed of a material such as A1. The essential feature of this embodiment is the downwardly protruding convex shape of the underside of the gate electrode 5a, with a stepwise transition from outer portions of that underside to a central protruding portion of the underside, whereby thick portions 2b of the $SiO_2$ insulating film 2 are formed between the n− diffusion regions 4 and the gate electrode 5a. In addition, each of the mutually opposing n− diffusion regions 4 extends to overlap the central protruding portion of the gate electrode underside, by a predetermined distance $D_1$ in the horizontal direction, while each of the outer portions of the underside of the gate electrode 5a extends to overlap by a predetermined distance $D_2$ an n+ diffusion region 3, in the horizontal direction, as shown in FIG. 5.

With the first embodiment of an MOS FET structure according to the present invention described above, a thick $SiO_2$ film regions 2b portion is formed between each lightly doped n-type diffusion region 4 and the gate electrode 5a, where the gate electrode 5a would otherwise be close to the diffusion regions 4. This enables the stray capacitance between the gate and drain to be reduced, thereby increasing the device switching speed and reducing power consumption. Moreover when there is a large voltage difference applied between the gate electrode and the drain diffusion region, the presence of the thick $SiO_2$ film regions 2b disposed between the mutually adjacent parts of the gate electrode 5a and the diffusion regions 4 will result in a reduction of the vertical component of electric field that is produced within the drain region, thereby causing the electric field concentration within the the lightly doped drain diffusion region 4 to be lowered, and the degree of energy band curvature reduced, by comparison with the prior art transistors described hereinabove. The various problems described hereinabove which arise as a result of high levels of electric field in the drain region can thereby be prevented.

Figure 1:
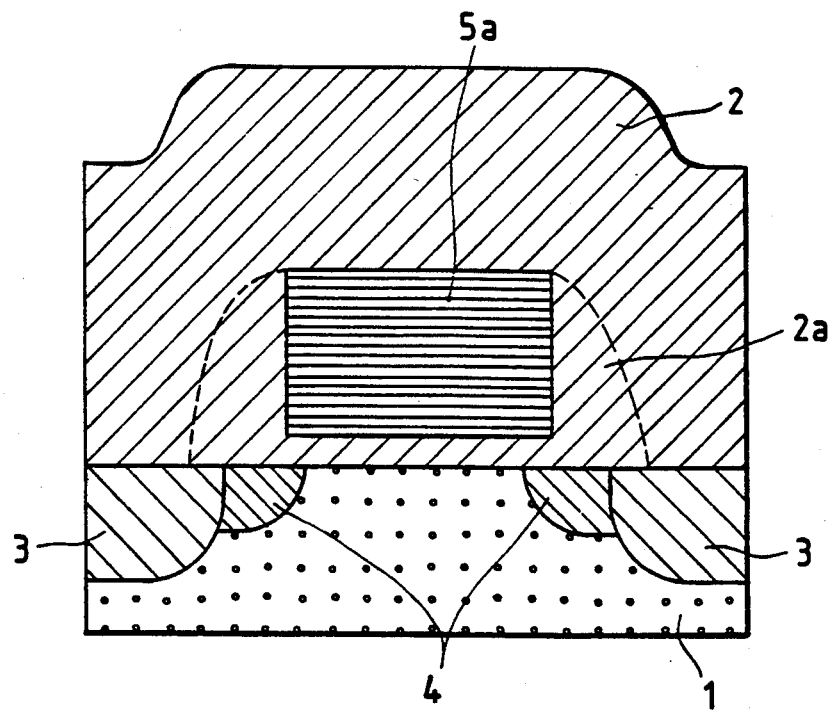
FIG. 1 is a cross-sectional view of a prior art LDD MOS fet.
Figure 2:
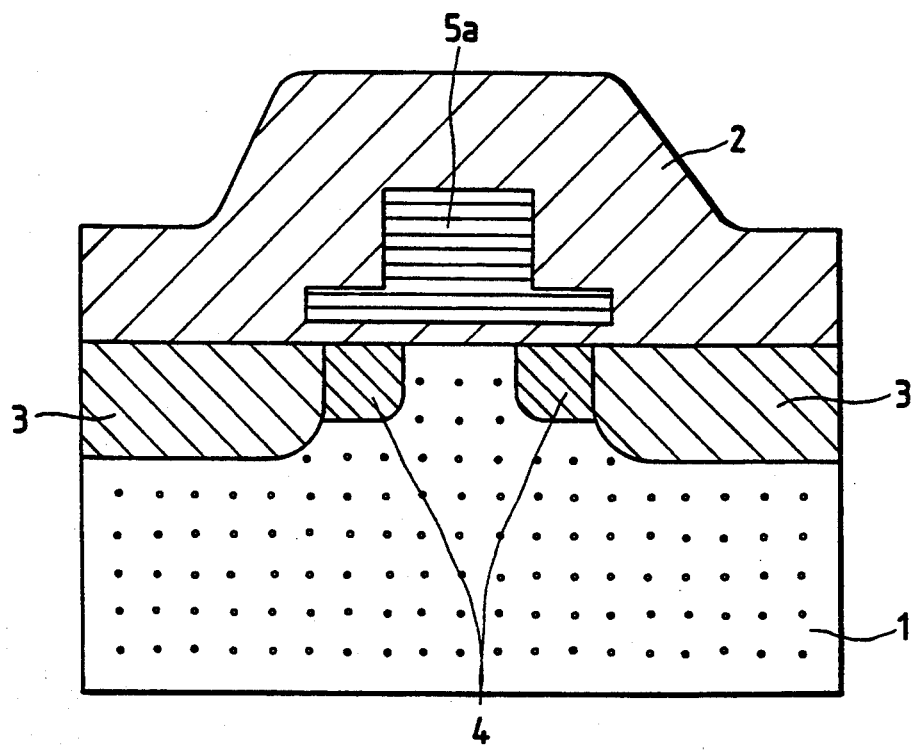
FIG. 2 is a cross-sectional view of a prior art Inverse-TMOS fet.
Figure 3A:
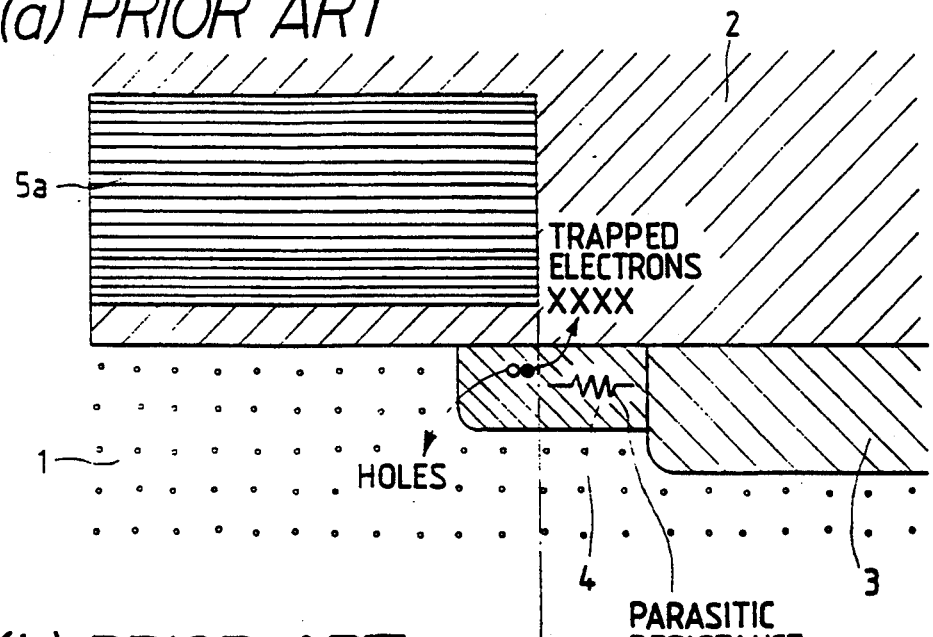
FIG. 3($a$) is an expanded partial cross-sectional view of the LDD MOS let of FIG. 1, showing details of a drain region at the substrate surface, and FIG. 3($b$) is a diagram showing electric field distribution within that region.
Figure 3B:
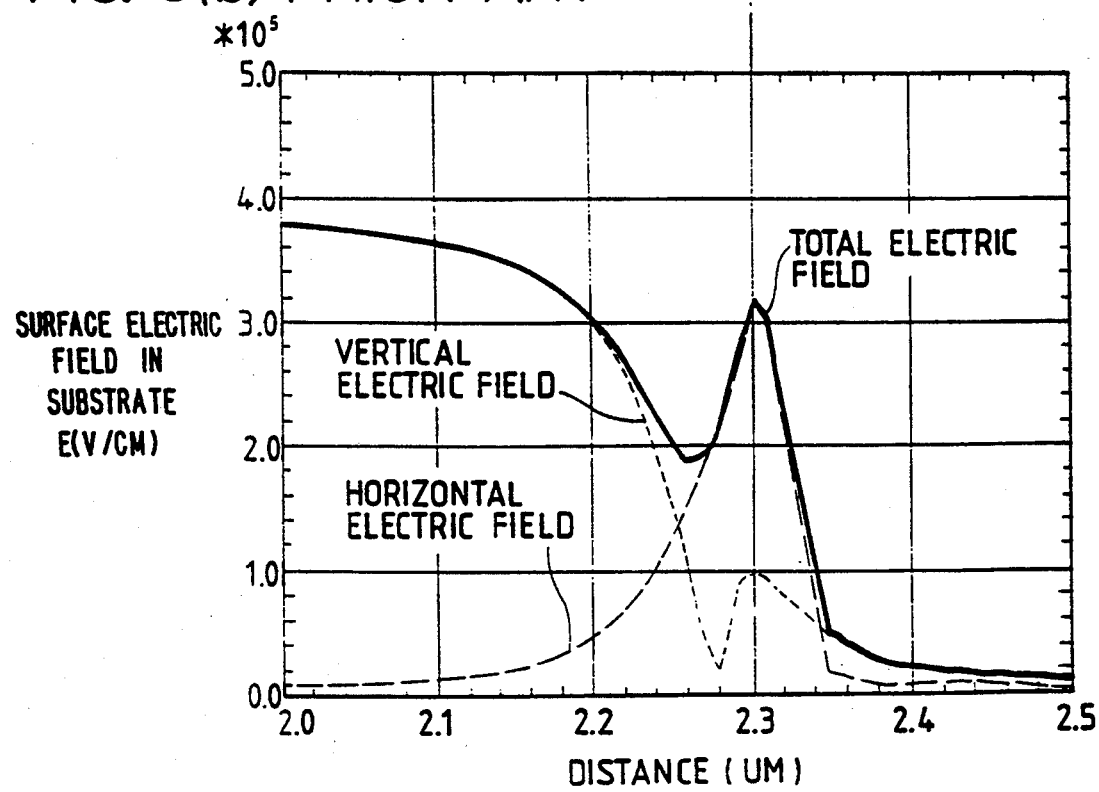
Figure 4A:
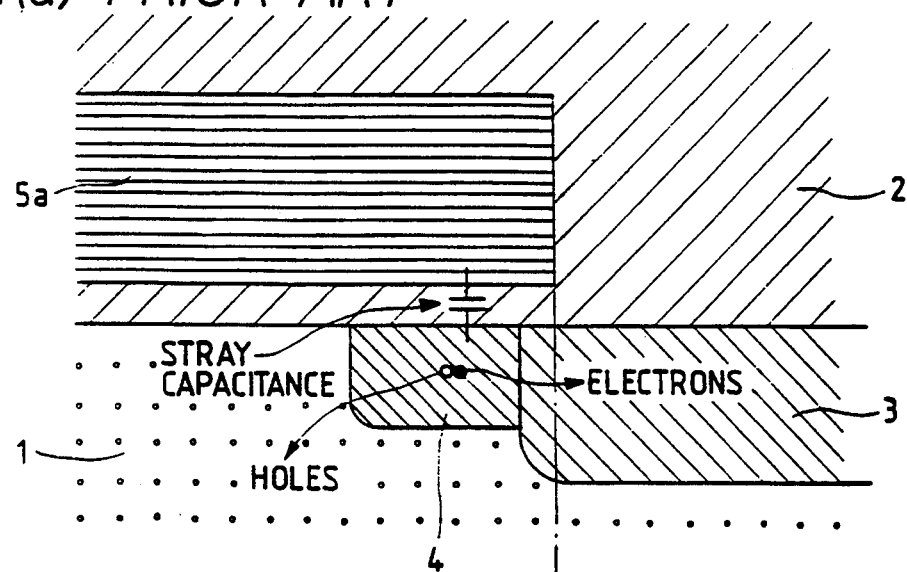
FIG. 4($a$) is an expanded partial cross-sectional view of the Inverse-TMOS let of FIG. 2, showing details of a drain region at the substrate surface, and FIG. 4($b$) is a diagram showing electric field distribution within that region.
Figure 4B:
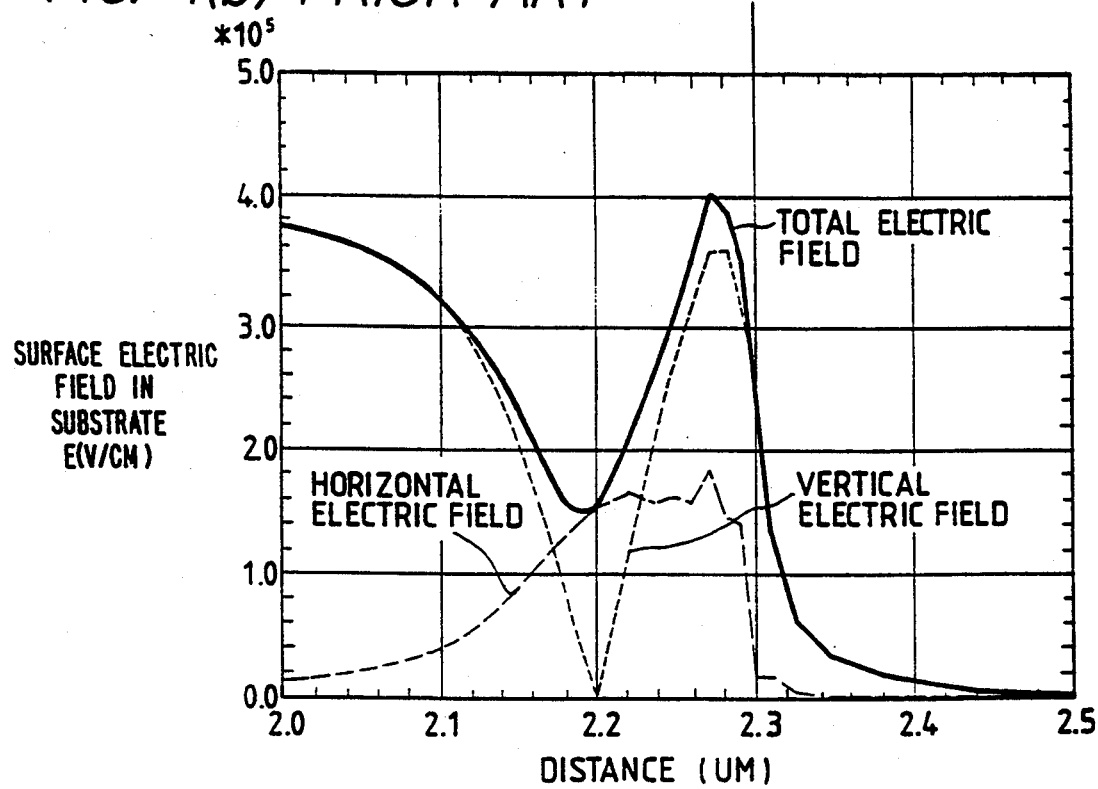
Figure 6A:
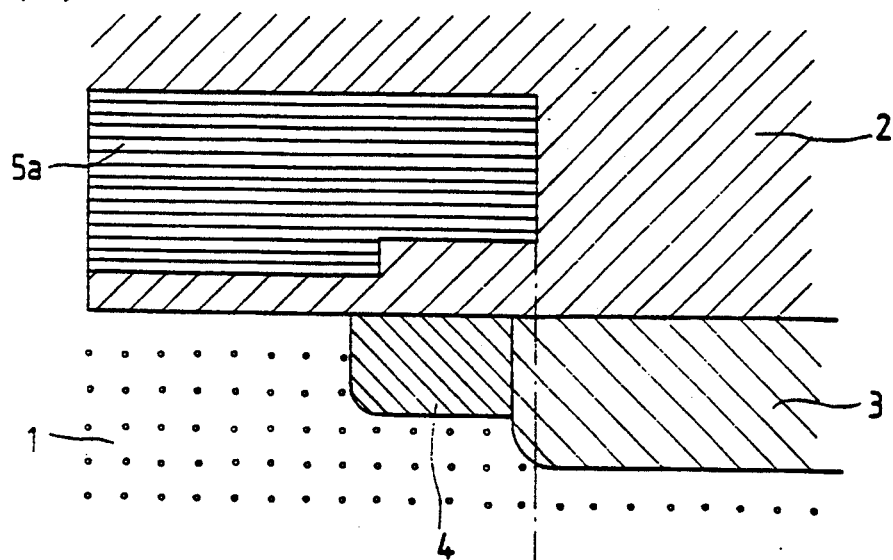
FIG. 6($a$) is an expanded partial cross-sectional view of the fet embodiment of FIG. 5, showing details of a drain region at the substrate surface, and FIG. 6($b$) is a diagram showing electric field distribution within that region.
Figure 6B:
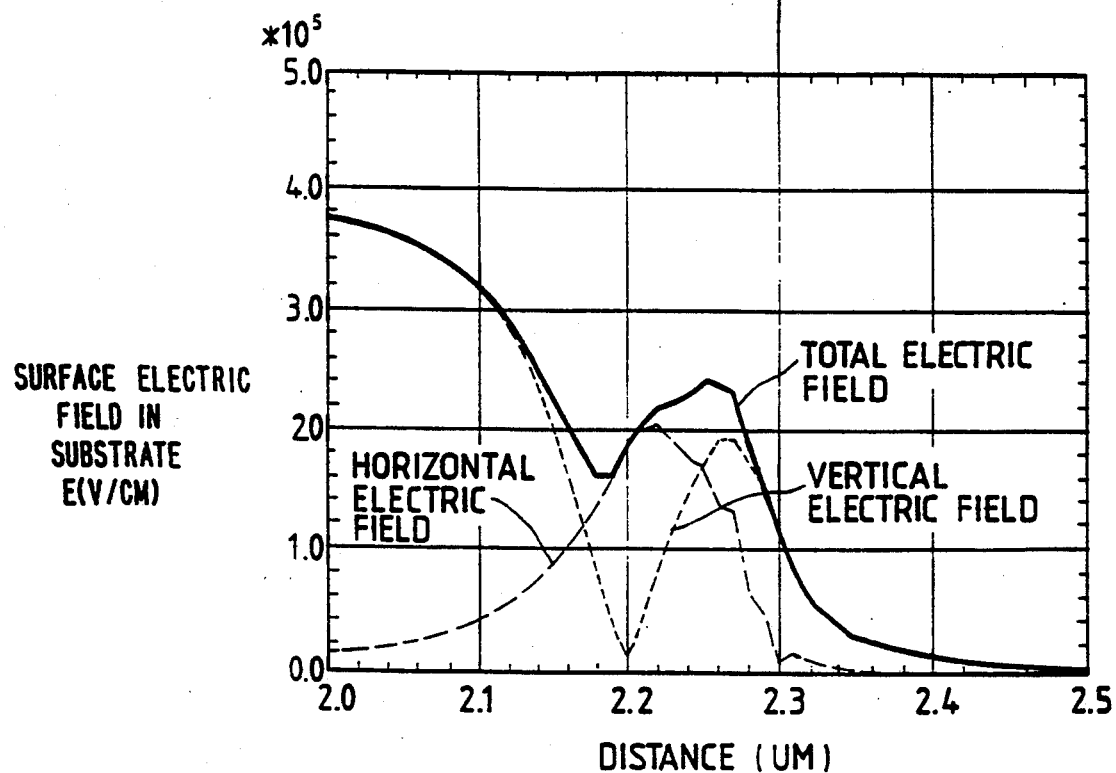

FIG. 6(a) is a partial expanded crosssectional view of the embodiment of FIG. 5, showing highly doped n-type diffusion region 3 which will be assumed to function as the source region, and the adjacent lightly doped n-type diffusion region 4 and gate electrode pa. In the corresponding FIG. 6(b), distances along the horizontal axis correspond to those of FIG. 6(c), and the distribution of electric field near the surface, of the Si substrate in the drain region is shown. The contents of that FIG. 6(a), as for the prior art LDD MOS transistor FIG. 6(a) of FIG. 3 and the prior art Inverse-TMOS transistor FIG. 4(a), were obtained by computer simulation, assuming a substrate potential of 0 V, a drain voltage of 3 v, and a gate voltage of 1.5 V. As shown by these diagrams, by comparison with the prior art LDD MOS transistor of FIGS. 3(a), and 3(b) the greatest values of horizontal electric field strength are shifted to a position beneath the gate electrode, with the transistor of the present invention. In addition, these diagrams clearly show that the maximum level of electric field in the lightly doped drain diffusion region resulting from the combination of horizontal and vertical components of the electric field in that region, is substantially smaller in the case of the present invention than with either of the prior art LDD MOS and Inverse-TMOS transistor structures, so that problems resulting from hot-electron emission will be reduced.

Figure 7:
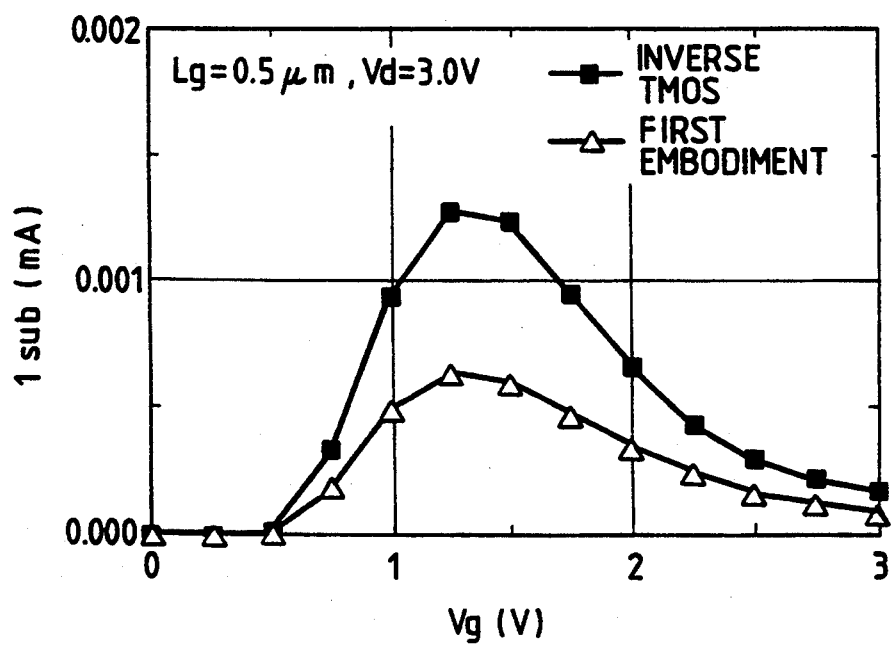
FIG. 7 shows graphs of dependency of substrate current level upon gate drive voltage, for the first embodiment of the present invention and a prior art Inverse-TMOS let respectively.

FIG. 7 is a graph showing the dependency of substrate current flow which results from hot-electron emission, when a drain voltage of 3 V is applied, for the case of an MOS transistor according to the first embodiment of the present invention and a prior art Inverse-TMOS transistor respectively. As shown, the first embodiment of the present invention has a level of substrate current that is approximately half of that of the Inverse-TMOS transistor.

Figure 8A:
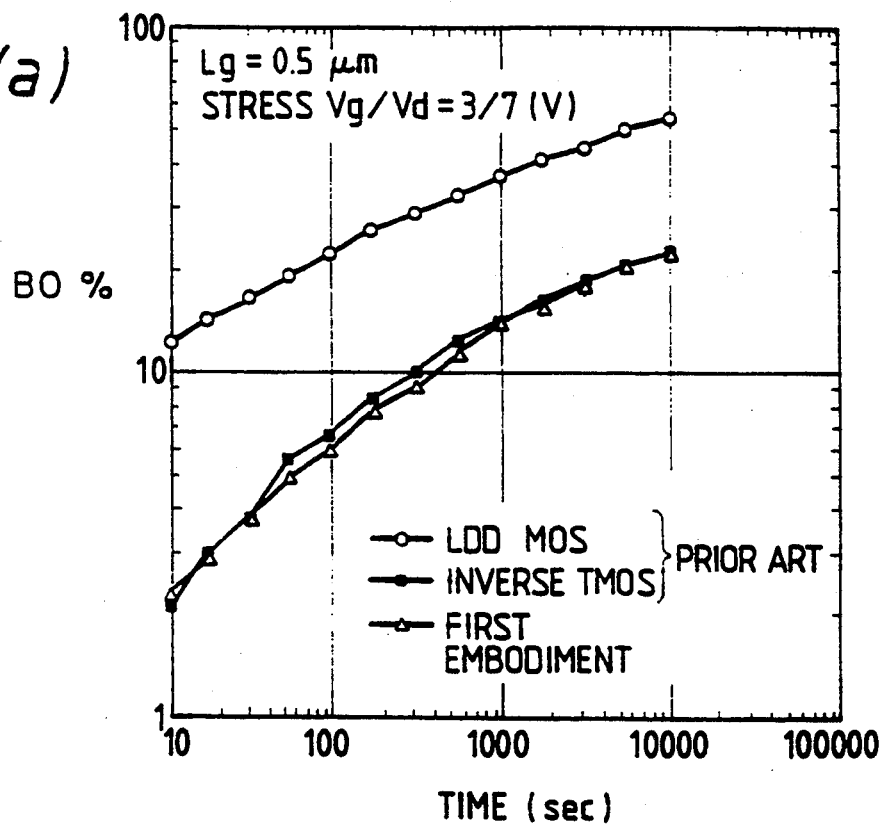
FIGS. 8($a$) and 8($b$) show graphs for comparing rates of degradation with elapsed time of drain current and transconductance, for the first embodiment of the present invention and the prior art Inverse-TMOS and LDD MOS fets respectively.
Figure 8B:
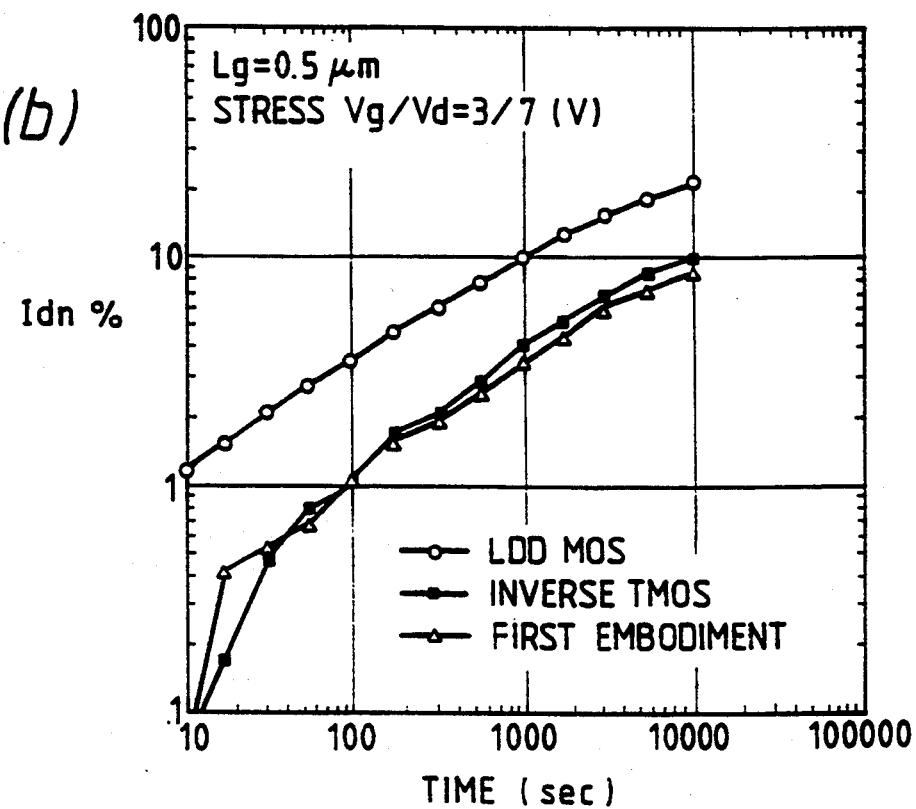

FIG. 8(a) in illustrates the degradation of drain current with elapsed time, for the case of a prior art LDD MOS transistor, a prior art Inverse-TMOS transistor, and a transistor according to the first embodiment of the present invention. FIG. 8(b) similarly provides a comparison of degradation of transconductance with elapsed time, for these respective transistor structures. As is shown, both the Inverse-TMOS transistor and the transistor according to the present invention provide an improvement over the prior art LDD MOS transistor.

Figure 9:
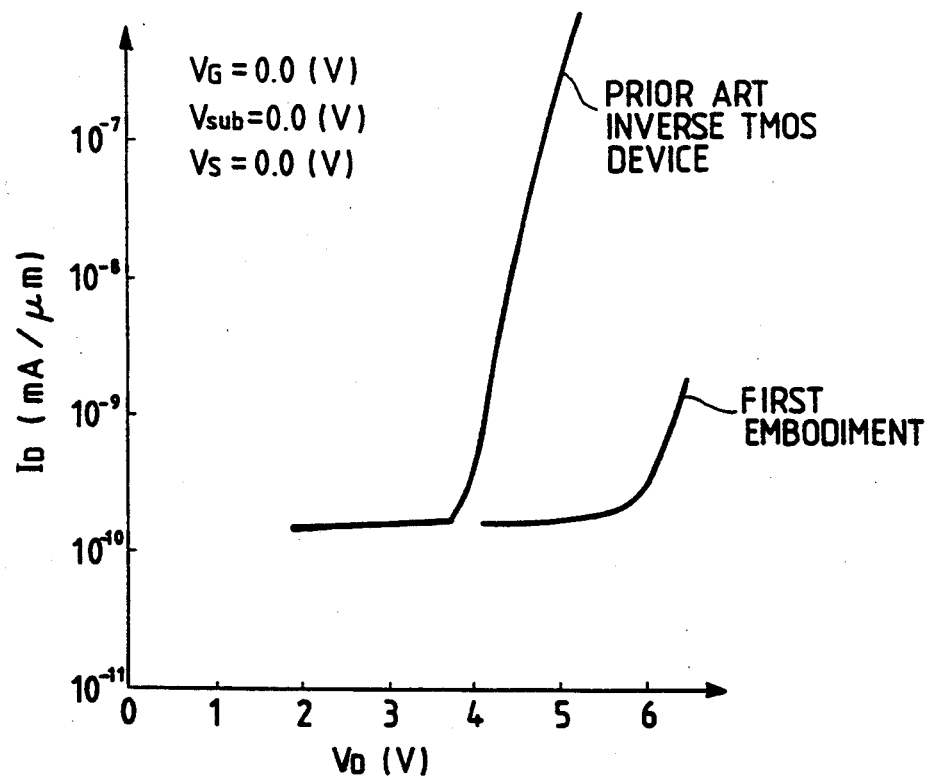
FIG. 9 shows graphs of gate diode leakage current for the first embodiment of the present invention and the prior art Inverse-TMOS let respectively.

FIG. 9 is a graph showing results of measurements of gate diode leakage current, obtained from tests carried out on transistors which were actually manufactured, for the the first embodiment of the present invention and for a prior art Inverse-TMOS transistor respectively. It was found, as shown, that the first embodiment of the present invention provides an improvement of approximately 2 V in the gate diode leakage withstanding voltage, by comparison with the prior art Inverse-TMOS transistor.

Table 1 below provides a comparison of device characteristics between the prior art Inverse-TMOS transistor and the first embodiment of the present invention, obtained from respective ring oscillator circuits having a fan-out of 1 which were constructed for testing purposes.

In the ring oscillator, due to the Miller effect, the drain-to-gate capacitance behaves as an effective capacitance of 2.5 times the gate capacitance at the channel, even although the actual capacitance values are substantially identical. As a result with a fan-out value of 1, the stray capacitance in the case of using transistors according to the first embodiment of the present invention will be only 85% of that for the case of the prior art Inverse-TMOS transistors being used. The shorter the gate length, the greater will this effect (i.e. of reduced stray capacitance value) become.

TABLE 1

|  | Inverse-TMOS FET | First embodiment of present invention |
|---|---|---|
| Stray capacitance (fF) | 149 | 125 |
| Power consumption (pJ/stage) | 0.326 | 0.269 |
| Delay time (psec/stage) | 87 | 74 |

(Lg = 0.5 micron, power supply voltage = 2.5 V)

As shown in the above table, use of transistors according to the first embodiment of the present invention will result in the delay time and the power consumption per stage also being each reduced to 85% of that for the case of the prior art Inverse-TMOS transistors being used.

The value of transconductance that is obtained with the first transistor embodiment of the present invention is substantially identical to that obtainable with the prior art Inverse-TMOS transistor, and thus due to the fact that the stray capacitance is smaller, use of the first transistor embodiment of the present invention will enable higher operating speed and lower power consumption to be achieved by comparison with that prior art device structure.

A second embodiment of a transistor structure according to the present invention will be described, whose basic objectives are to provide a MOS FET in which the amount of stray capacitance between drain and gate is small, and in which the level of electric field within a lightly doped drain diffusion region is held low, to thereby eliminate problem such as gate diode leakage currents without a reduction in the device drive capability, as for the first embodiment described above, and furthermore in which there is a reduced amount of stray capacitance between the the transistor and adjacent connecting lines.

Figure 10:
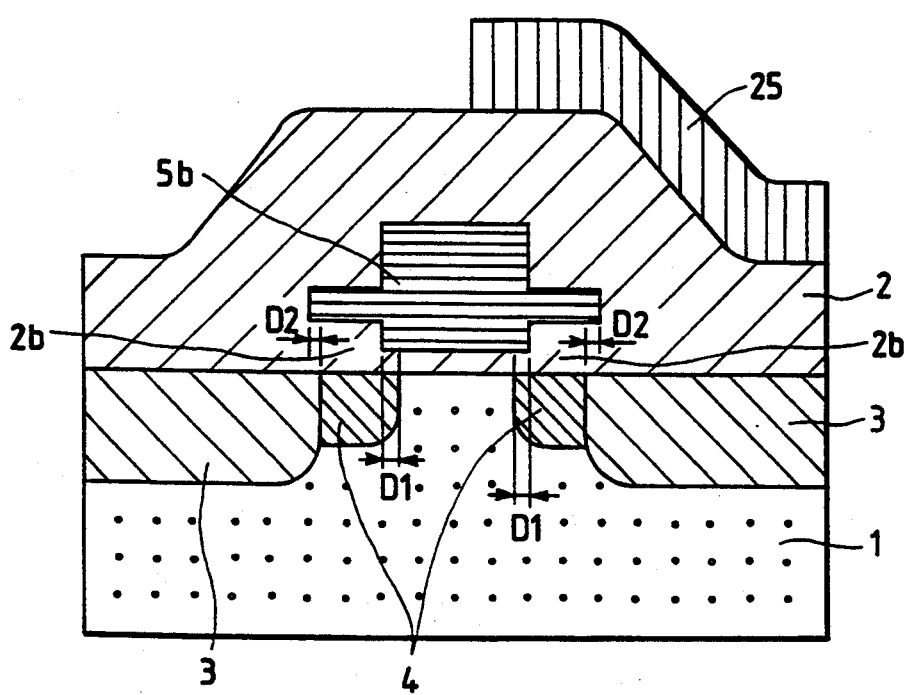
FIGS. 10, 11 and 12 are respective cross-sectional views of second, third and fourth embodiments of MOS FETs according to the present invention.

FIG. 10 is a cross-sectional view of the second embodiment, in which numeral 1 denotes a p-type semiconductor substrate, 2 denotes an insulating film, 3 denotes highly doped n-type diffusion regions (n+ regions) functioning as the drain and source diffusion regions, 4 denotes lightly doped n-type diffusion regions (n− regions) one of which functions (as described hereinabove for the first embodiment) as a lightly doped drain diffusion region 5b denotes a gate electrode which is formed in the shape of a cross, as viewed in cross-section, and formed of a material such as Si, polysilicon, tungsten, etc. Numeral 25 denotes a connecting line formed of a material such as Al.

As for the first embodiment described above, the gate electrode 5b of this embodiment has the underside thereof formed with a downwardly protruding convex shape, however with the second embodiment, the top face of the gate electrode 5b is formed with an upwardly protruding convex shape. As for the first embodiment, parts of the lightly doped drain and source diffusion regions 4 which are close to the gate electrode 5b are separated therefrom by thick portions 2b of the SiO₂ insulating film 2, so that the stray capacitance between drain and gate is kept small and a high speed of switching can be achieved. Thus the advantages described hereinabove are obtained whereby the maximum electric field strength in the drain region at the substrate surface is held low so that hot-electron emission and energy band curvature is reduced, and the various problems arising therefrom are substantially reduced. In addition to these advantages, the second embodiment provides the further advantage that a greater separation is provided between the gate electrode 5b and the connecting line 25, as a result of the gate electrode 5b being formed in the shape of a cross, as seen in cross-section. Hence, the stray capacitance between the connecting line 25 and the gate electrode 5b is reduced.

Figure 11:
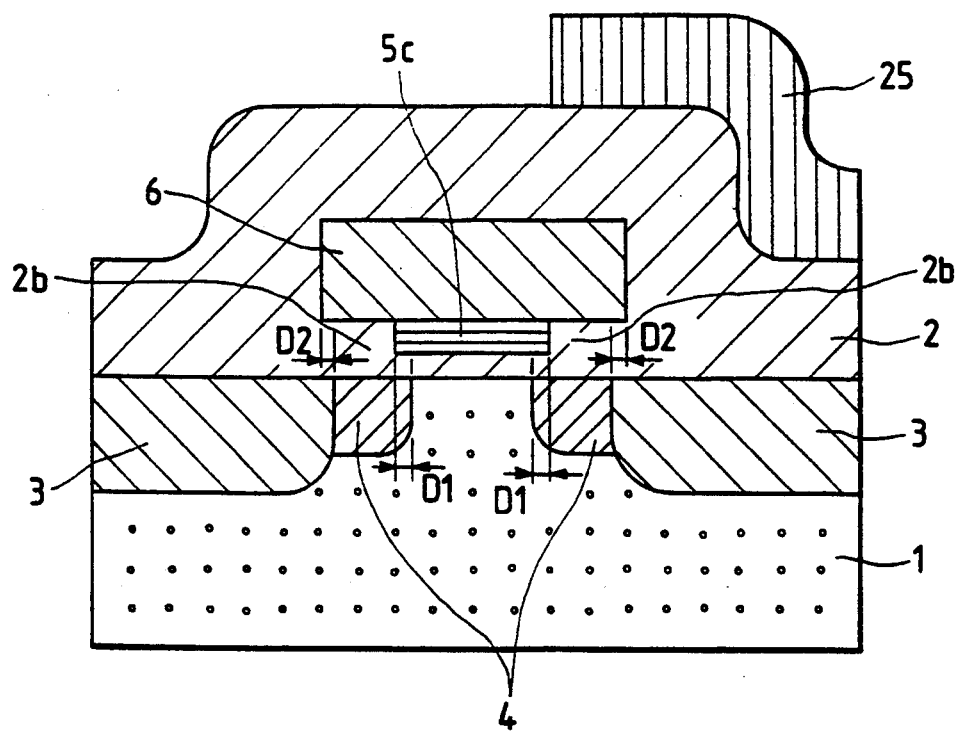

A third embodiment of a transistor structure according to the present invention will be described, whose basic objectives are to provide a MOS FET in which the amount of stray capacitance between drain and gate is small, and in which the level of electric field in the lightly doped drain diffusion region is held low, to thereby eliminate problem such as gate diode leakage currents without a reduction in the device drive capability, as for the first embodiment described above, but in which even more effective, lowering of the electric field strength is achieved. FIG. 11 is a cross-sectional view of the third embodiment. As shown, the configuration is almost identical to that of the embodiment of FIG. 5. The difference is that with the second embodiment, the gate electrode is formed of two layers of respectively different material, designated by numerals 6 and 5c. With this embodiment, if a p-type semiconductor substrate is used, then the upper layer 6 of the gate electrode is formed of a material (for example n-type polysilicon) whose work function is greater than that of the layer 5c (which is formed for example of tungsten), while if an n-type semiconductor substrate is used then the upper layer 6 of the gate electrode is formed of a material (for example p-type polysilicon) whose work function is greater than that of the lower layer 5c of the gate electrode.

With this embodiment as for the first embodiment, parts of the lightly doped drain and source diffusion regions 4 which are close to the gate electrode (i.e. close to the upper layer 6 of the gate electrode) are separated therefrom by thick portions 2b of the SiO₂ insulating film 2, so that the stray capacitance between drain and gate is kept small. Thus the advantages described hereinabove are obtained whereby the maximum electric field strength in the drain region at the substrate surface is held low so that hot-electron emission and energy band curvature is reduced, and the various problems arising therefrom are substantially reduced. However in addition, when a voltage is applied to the gate electrode of this embodiment, the (absolute) value of voltage that is actually applied by the layer 6 of the gate electrode will be smaller than that applied by the layer 5c of the gate electrode, as a result of the difference between the values of work function of the materials forming the layers 5c and 6. That is to say, even when there is a large difference between the externally supplied voltages applied to the gate electrode and the drain, the effective voltage difference between gate and drain that is produced within the lightly doped drain diffusion region 4 will be reduced by an amount equal to the difference between the work functions of the layers 5c and 6. Thus the vertical component of the electric field (and hence the maximum electric field concentration) within the lightly doped drain diffusion region 4 will be reduced by comparison with the first embodiment, so that gate diode leakage current can be reduced, and at the same time the degree of hot-electron emission and energy band curvature within the drain region will be reduced and hence the various problems of device degradation, gate insulating film breakdown, etc. that result from a high level of hot-electron emission dan be substantially alleviated.

Figure 12:
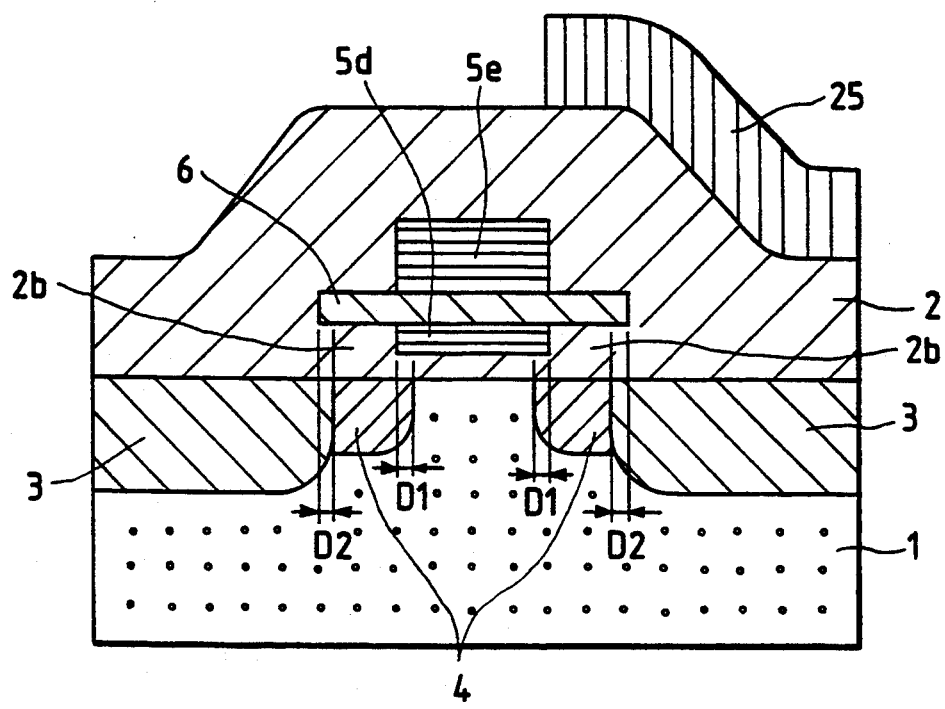

A fourth embodiment of a MOS FET device according to the present invention will be described, referring to the cross-sectional view of FIG. 12, whose objectives and configuration are similar to those of the second embodiment of FIG. 11 described hereinabove. This embodiment differs from that of FIG. 11 in that the gate electrode is formed of three layers, i.e. a lower layer 5d, a central layer 6 and an upper layer 5e, with each of the layers 5d and 5e being narrower in horizontal width than the layer 6, so that the gate electrode is formed in the shape of a cross, as viewed in cross-section. If a p-type semiconductor substrate is used, then the central layer 6 of the gate electrode is formed of a material (for example n-type polysilicon) whose work function is greater than that of the lower layer 5d (which is formed for example of tungsten), while if an n-type semiconductor substrate is used then the central layer 6 is formed of a material (for example p-type polysilicon) whose work function is greater than that of the lower layer 5d. In this embodiment the upper layer 5e of the gate electrode is assumed to be formed of the same material as the lower layer 5d, however it would be possible to form the upper layer 5e as an upward extension of the layer 6, depending upon the method of manufacture that is adopted.

With the fourth embodiment, the advantages of the second embodiment described above are obtained, i.e. a lower amount of stray capacitance between the gate electrode and a connecting line 25 which passes above the gate electrode, together with the advantages provided by the third embodiment, i.e. a lowering of the vertical component of electric field that is developed within the lightly doped drain diffusion region 4, with an accompanying reduction of gate diode leakage and of hot-electron emission within the diffusion region 4, and consequent reduction of problems of device degradation and gate insulating film breakdown that are caused by hot-electron emission.

Figure 13A:
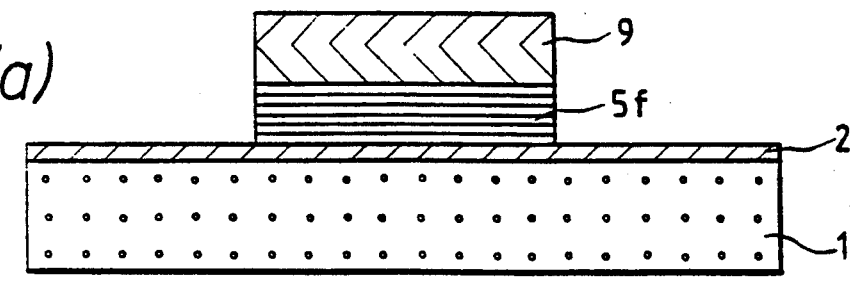
FIG. 13($a$) through 13($h$) show successive stages of a first embodiment of a method of manufacture for a MOS FET according to the present invention.

A first embodiment of a method of manufacture according to the present invention will be described, whose objectives are to provide a method of manufacture for a MOS FET, having a basic configuration in accordance with the first embodiment of the present invention described above, which can be easily adapted to current types of LSI manufacturing process. FIGS. 13(a) to 13(h) of FIG. 13 show successive steps in this method of manufacture, as cross-sectional views. In FIG. 13(a), a SiO2 insulating film 2 is formed over an upper face of a p-type Si semiconductor substrate to a depth of 10 nm, then a layer of material such such as polysilicon formed over the SiO2 insulating film 2, then an insulating film 9 is formed over that polysilicon layer, with these layers being successively formed by CVD (chemical vapor deposition). The gate electrode 5f and overlying insulating film 9 are then formed to the shape shown in FIG. 13(b), by forming a patterned mask by photolithography and executing anisotropic etching using the mask.

Figure 13B:
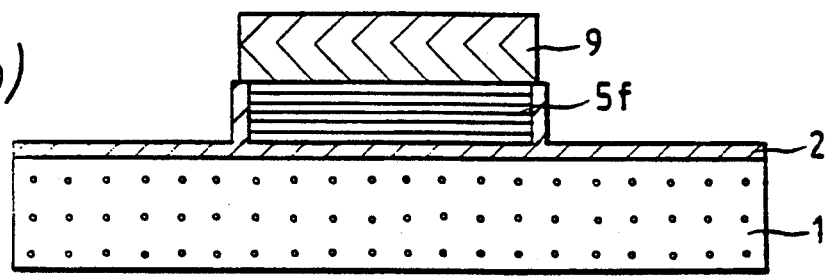
Figure 13C:
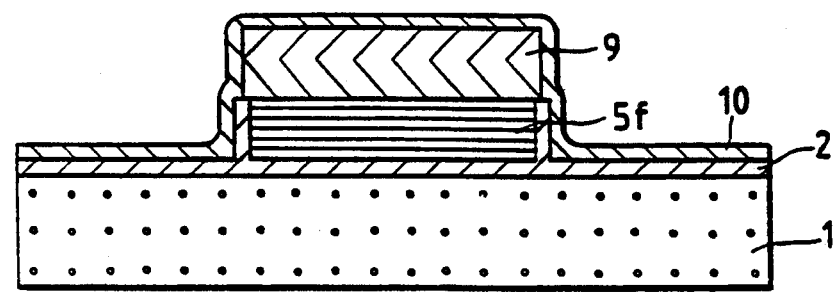

Next in FIG. 13(b), the side faces of the gate electrode 5f are oxidized to a depth of for example 5 nm, by an oxidation process In FIG. 13(c), a region including the gate electrode is covered by an insulating film 10 as shown (e.g. formed of Si3n4 film) by passing oxygen over the surface.

Figure 13D:
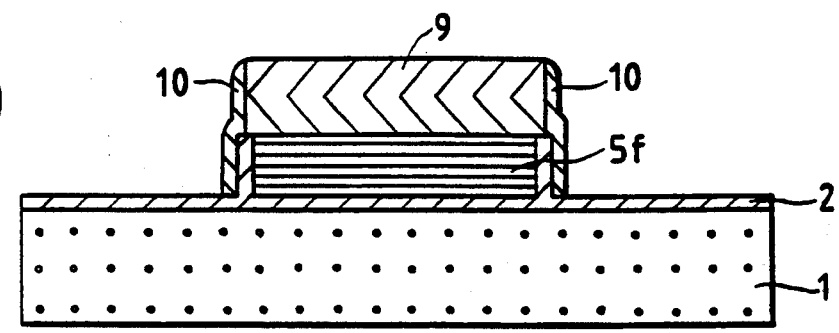

In FIG. 13(d), strongly anisotropic etching in the vertical direction is executed, to selectively remove the insulating film 10, leaving portions of the film 10 covering (vertical) side faces of the gate electrode 5f and the insulating film 9.

Figure 13E:
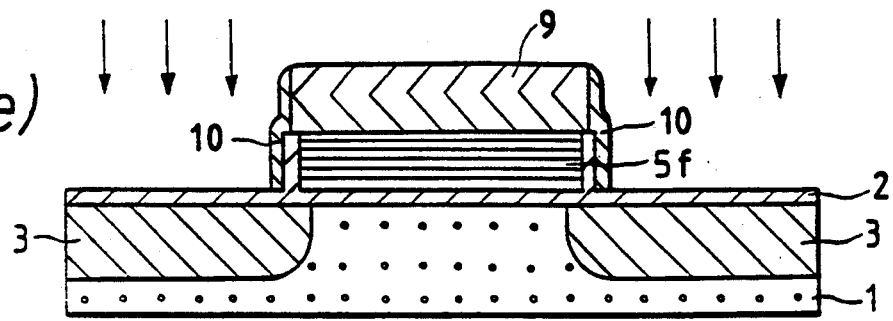

In FIG. 13(e), ion implantation is executed to implant As ions to produce a doping concentration of $4 \times 10^{15}$ cm$^{-2}$, to form the n-type highly doped diffusion regions 3 within the upper surface of the p-type semiconductor substrate 1, such that these diffusion regions each extend to a position below the gate electrode 5f.

Figure 13F:
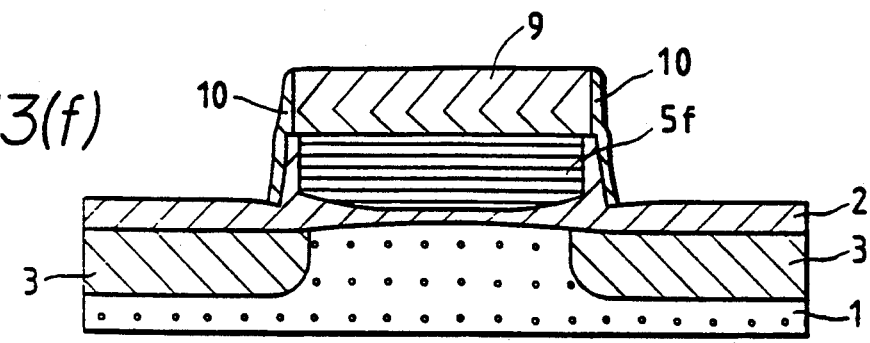

In FIG. 13(f), oxidation is executed of the lower parts of the right and left (vertical) side faces (as viewed in FIGS. 13(a)–13(h) of the gate electrode 5f, while preventing oxidation of the upper parts of these side faces of the gate electrode 5f by the action of the insulating film 10. Thick portions of the SiO2 insulating film 2 are thereby formed below these side faces of the gate electrode 5f, i.e. the underside of the gate electrode 5f is formed to a downwardly protruding convex shape, with a thin region of the SiO2 insulating film 2 being disposed between a central region of that underside and the upper face of the semiconductor substrate 1 and thick regions of film 2 being formed between outer parts of the underside of the gate electrode (below the aforementioned side faces) and the substrate surface.

Figure 13G:
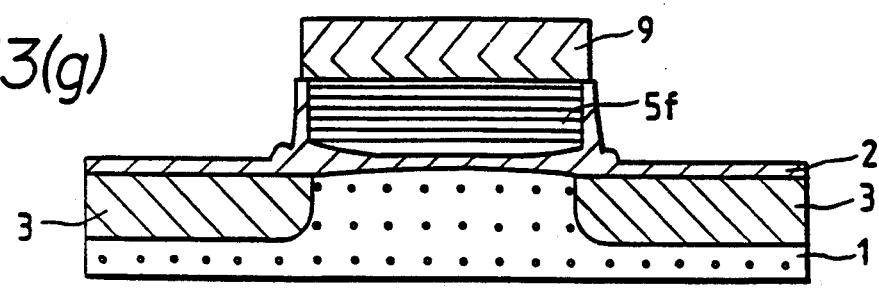

In FIG. 13(g), etching is executed to selectively remove the insulating film 10 while leaving that film remaining over the side faces of the gate electrode 5f.

Figure 13H:
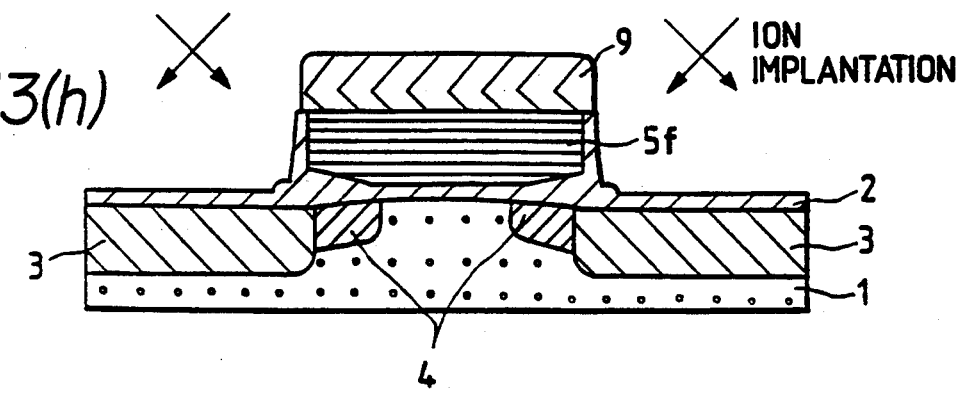

In FIG. 13(h), large tilt angle ion implantation (e.g. at approximately 45°) is executed to implant P ions in the upper face of the semiconductor substrate 1, to produce a doping concentration of $4 \times 10^{13}$ cm$^{-2}$, to thereby form the n-type lightly doped diffusion regions 4 such that each extends to to a sufficient extent below the gate electrode 5f to reach a position below the aforementioned thin region of the SiO2 insulating film 2.

The above method of manufacture embodiment can be easily realized by current types of LSI manufacturing technology, and enables MOS FETs having the structure of the first embodiment of the present invention to be produced by making full use of self alignment and without requiring a large number of processing steps.

Figure 14A:
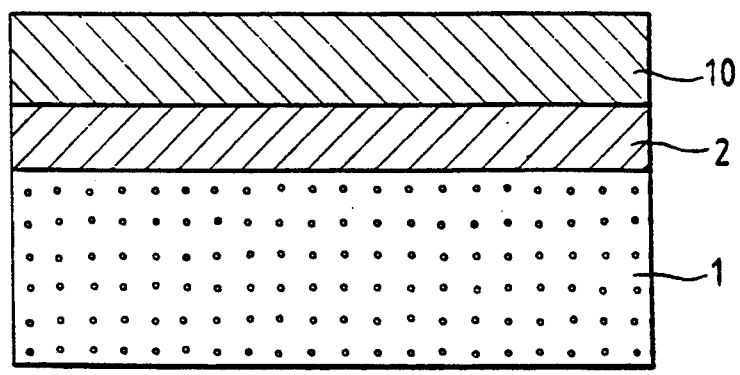
FIG. 14(a) to FIG. 14($i$) show successive stages of a second embodiment of a method of manufacture for a MOS FET according to the present invention.

A second embodiment of a method of manufacture according to the present invention will be described, which is suitable for manufacturing MOS FETs in accordance with the first device embodiment of the invention described hereinabove referring to FIG. 5. FIGS. 14(a) to 14(i) show successive steps in the manufacturing process, as respective cross-sectional views. In FIG. 14(a), a SiO2 insulating film 2 is formed on a p-type si substrate to a thickness of 30 nm, then a second insulating film 10 formed of a material such as Si3N4, having a different etching ratio from that of the SiO2, is formed over the SiO2 insulating film 2.

Figure 14B:
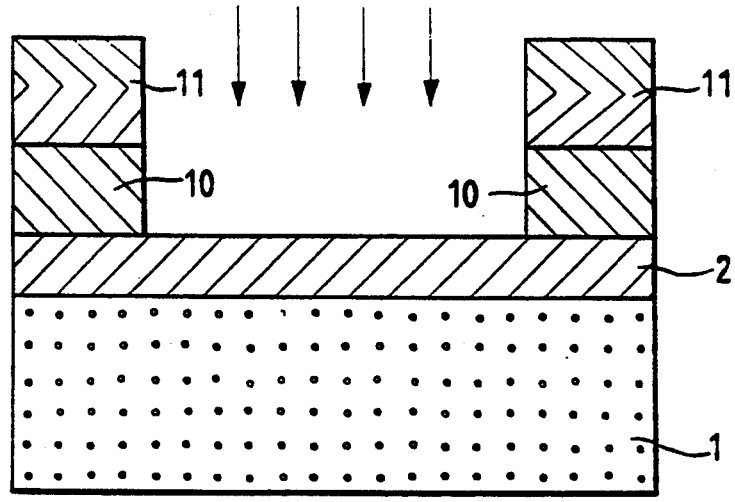

In FIG. 14(b), anisotropic etching is executed using a photolithography mask 11, to selectively remove portions of the insulating film 10 to thereby form an opening in the second insulating film 10, then VT control ion implantation is executed in the channel region only, using the insulating film 10 as a mask (for example with boron ions being implanted to a concentration of $3 \times 10^{13}$ cm$^{-2}$).

Figure 14C:
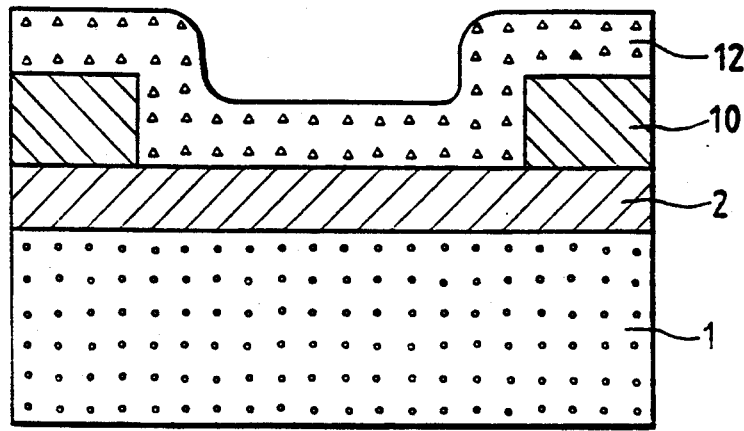

In FIG. 14(c), the mask 11 is removed, and a polysilicon film 12 (i.e. formed of a material having a different etching ratio from that of the SiO2 insulating film 2 and the insulating film 10) is formed overall, to a depth of 100 nm.

Figure 14D:
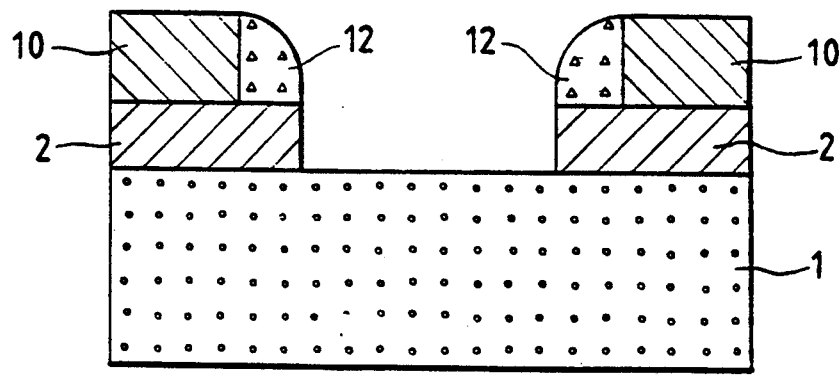

In FIG. 14(d), strongly anisotropic etching is executed in the vertical direction, to selectively remove the polysilicon film 12, leaving portions of that film remaining only on side faces of the insulating film 10, then the SiO₂ insulating film 2 is selectively removed by etching, using the films 10 and 12 as a mask, to thereby form an opening in the first insulating film 2 that is concentric with and smaller than the aforementioned opening formed in the second insulating film 10.

Figure 14E:
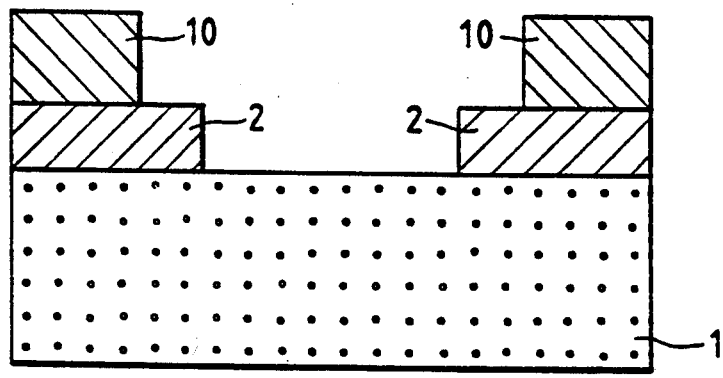
Figure 14F:
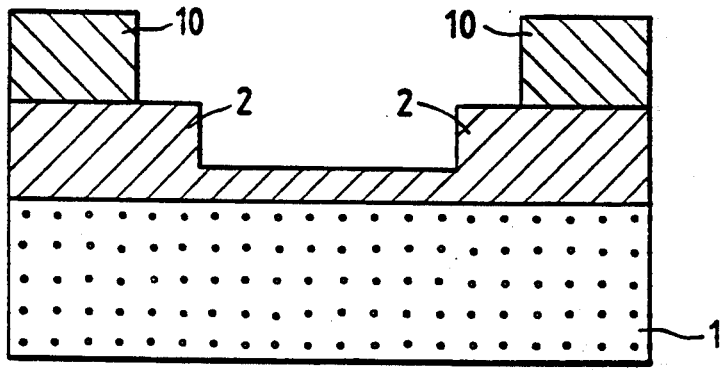

In FIG. 14(e), the polysilicon film 12 is removed by etching, leaving the remaining films unchanged.

In step (f), oxidation is executed through the aperture that has been formed in the SiO₂ insulating film 2 exposing the surface of the semiconductor substrate 1, to cover the exposed region of the substrate surface with a thin portion of SiO₂ insulating film 2.

Figure 14G:
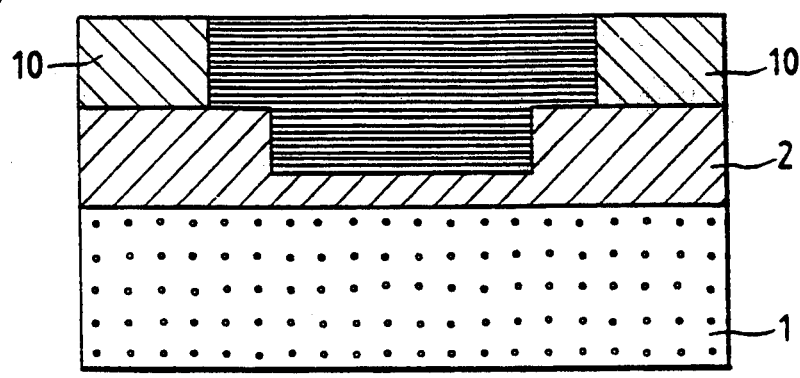

In FIG. 14(g), conducting material is deposited in the step-sided aperture that has been formed in the insulating film 10 and SiO₂ insulating film 2, to form the gate electrode 5g, so that the gate electrode 5g is thereby formed with a downwardly protruding convex shape.

Figure 14H:
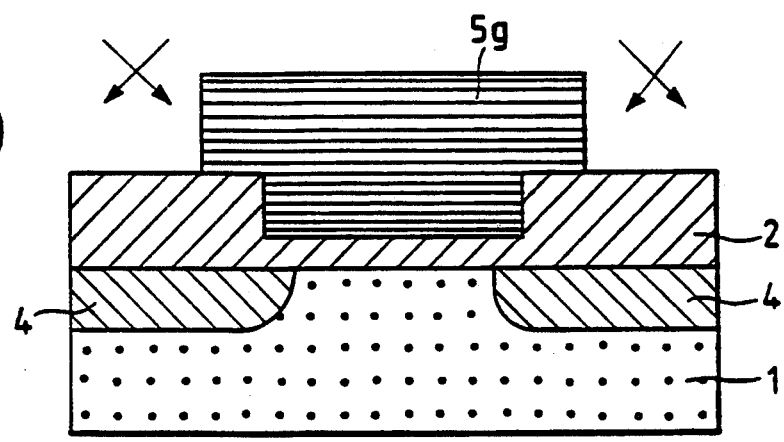

In FIG. 14(h), etching processing is executed to selectively remove only the film 10, then large tilt angle ion implantation is executed using the gate electrode 5g as a mask, to implant P ions in the upper face of the semiconductor substrate 1 to a doping concentration of $4 \times 10^{13}$ cm$^{-2}$ for thereby forming the lightly doped diffusion regions 4 such that each extends to to a sufficient extent below the gate electrode 5f to reach a specific position below the aforementioned thin portion of the SiO₂ insulating film 2. That position is such that the amount of overlap in the horizontal direction between the gate electrode 5f and each diffusion region 4, where these are most closely mutually adjacent, is the amount D1 (corresponding to the amount D1 shown in FIG. 5).

Figure 14I:
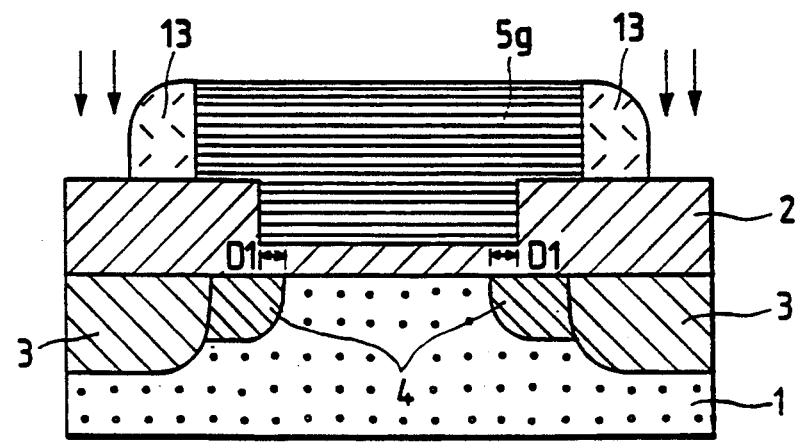

In a final FIG. 14(i), an HTO insulating film 13 is formed overall by CVD, then is selectively removed by strongly anisotropic etching in the vertical direction to leave portions of the insulating film 13 only upon (vertical) side faces of the gate electrode 5g. This is followed by ion implantation of As ions to a concentration of $4 \times 10^{15}$ cm$^{-2}$ to thereby form the n-type highly doped diffusion regions 3 in the upper face of the semiconductor substrate 1.

As for the first method embodiment described hereinabove, the second method embodiment can be easily realized by current types of LSI manufacturing technology, and enables MOS FETe according to the first device structure embodiment of the present invention to be produced by effectively using self alignment and without requiring a large number of processing steps.

A third embodiment of a method of manufacture for a MOS FET according to the present invention will be described, whose objectives are to provide a method of manufacture for a MOS FET, having a basic configuration in accordance with the fourth device structure embodiment of the present invention described above referring to FIG. 12, which can be easily adapted to current types of LSI manufacturing process. FIGS. 15(a) to 15(g) show successive steps in this method of manufacture, as cross-sectional views. In the step illustrated in FIG. 15(a), a SiO₂ insulating film 2 is formed on an upper face of a p-type Si semiconductor substrate 1 to a depth of 10 nm, then a layer 5d is formed to a depth of 10 nm over the SiO₂ insulating film 2, for use in forming a lower layer portion 5d of a gate electrode, a layer of material for use in forming a central layer portion 6 of the gate electrode is then formed, and then a layer of material for use in forming an upper layer portion 5e of the gate electrode is deposited, with these layers being successively formed by CVD. The layer 6 is formed of a material which is more resistant to etching than the layers 5d, 5e. Anisotropic etching of the last three layers is then executed after forming a photolithography mask, to obtain the gate electrode formed of the three layers 5d, 6, 5e as shown.

Figure 15A:
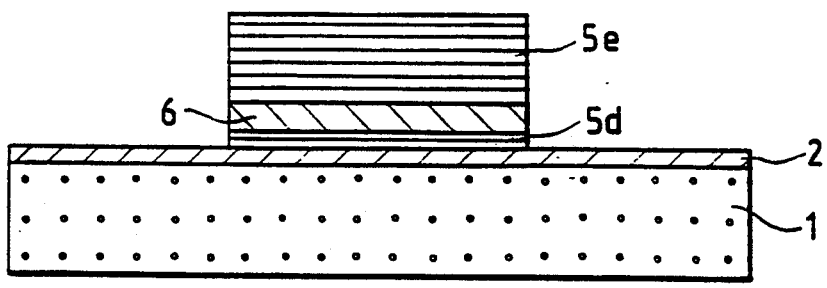
FIG. 15($a$) to FIG. 15($g$) show successive stages of a third embodiment of a method of manufacture for a MOS FET according to the present invention.
Figure 15B:
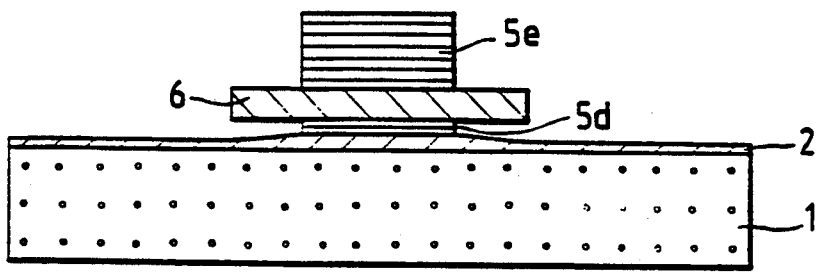

In FIG. 15(b), isotropic etching is executed to remove side portions of the layers 5d, 5e of gate electrode to a depth of approximately 0.1 μm, leaving the layer 6 unchanged.

Figure 15C:
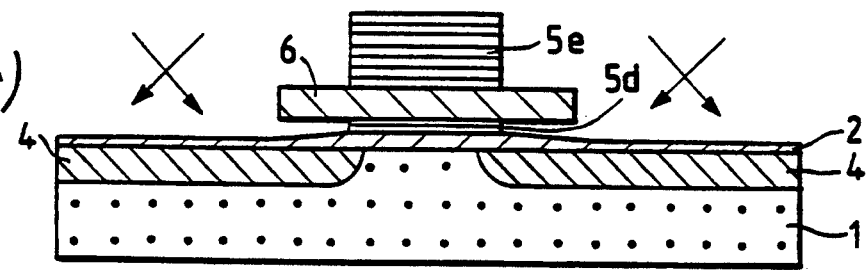

In FIG. 15(c), large tilt angle (e.g. 45°) ion implantation of P ions into the upper face of the semiconductor substrate 1 is executed, to a concentration of $4 \times 10^{13}$ cm$^{-2}$ to thereby form n-type lightly doped diffusion regions 4 within that upper face, such that each diffusion region 4 extends to a position below the lower layer 5d of the gate electrode, and is separated from that lower layer by the SiO₂ insulating film 2.

Figure 15D:
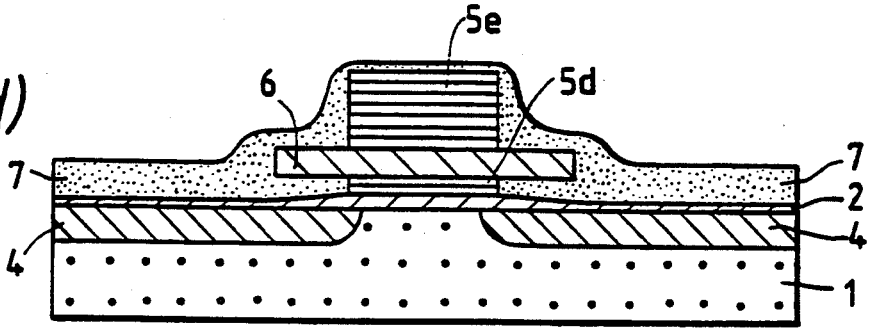

In FIG. 15(d) an insulating film 7, consisting of a material which is suitable for fellow processing (for example, BPSG film), is then formed overall by thermal reflow processing such as to reach a depth of 100 nm over the SiO₂ insulating film 2, and to reach a smaller depth upon the upper layer 5e of the gate electrode.

Figure 15E:
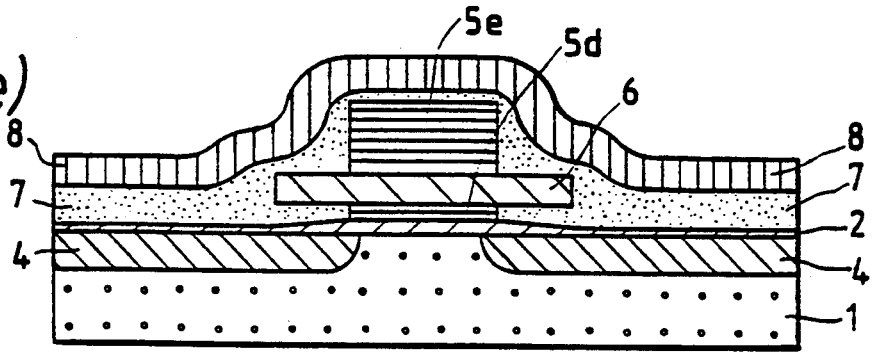

In FIG. 15(e), an insulating film 8 (for example, HTO film) is formed over the insulating film 7, to a depth of 200 nm.

Figure 15F:
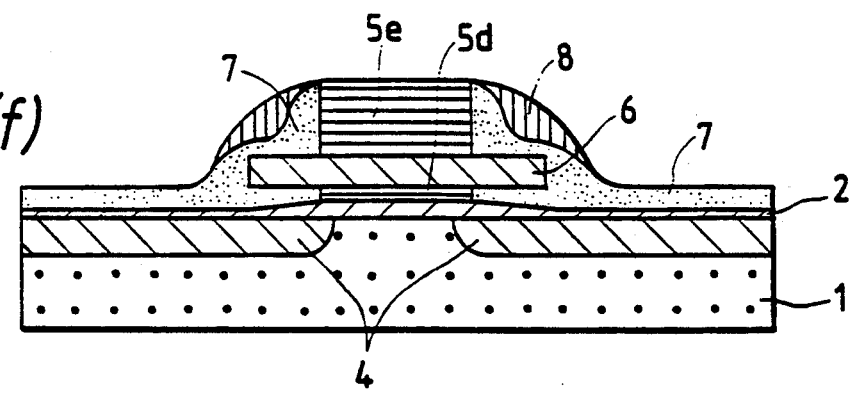

In FIG. 15(f), strongly anisotropic etching is executed in the vertical direction, to selectively remove the insulating film 8 except from regions of the insulating film 7 which cover the side faces of the gate electrode layers 5d, 6 and 5e.

Figure 15G:
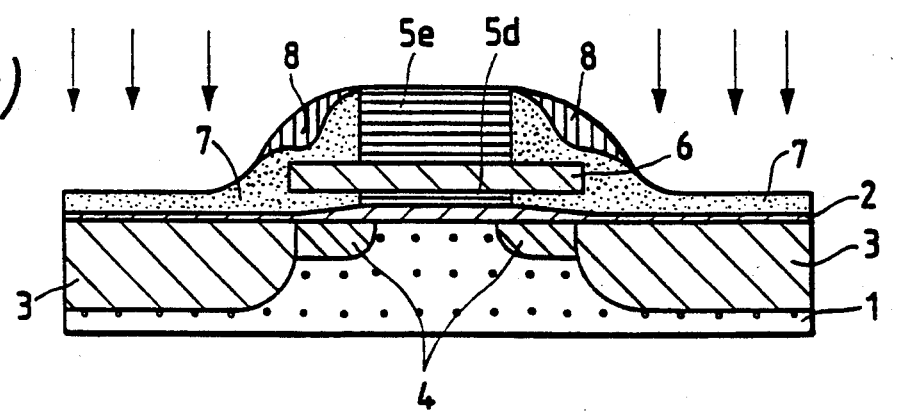

In FIG. 15(g), ion implantation is executed of As ions into the upper face of the semiconductor substrate 1, to a doping concentration of $4 \times 10^{15}$ cm$^{-2}$ to form the n-type highly doped diffusion regions 3 such that these each extend to a position below the layer 6 of the gate electrode.

As for the first two embodiments of methods of manufacturing MOS FETs according to the present invention, the third method embodiment described above can be easily realized by current types of LSI manufacturing technology, and this embodiment enables MOS FETs having the structure of the fourth device embodiment of the present invention to be produced by effectively using self alignment and without requiring a large number of processing steps.

Figure 16A:
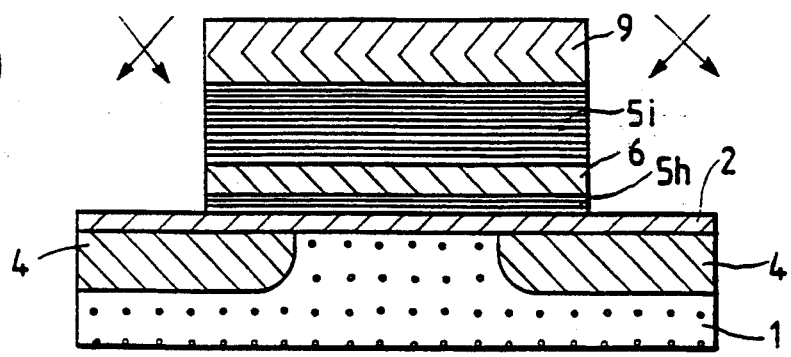
FIG. 16($a$) to FIG. 16($c$) show successive stages of a fourth embodiment of a method of manufacture for a MOS FET according to the present invention.
Figure 16B:
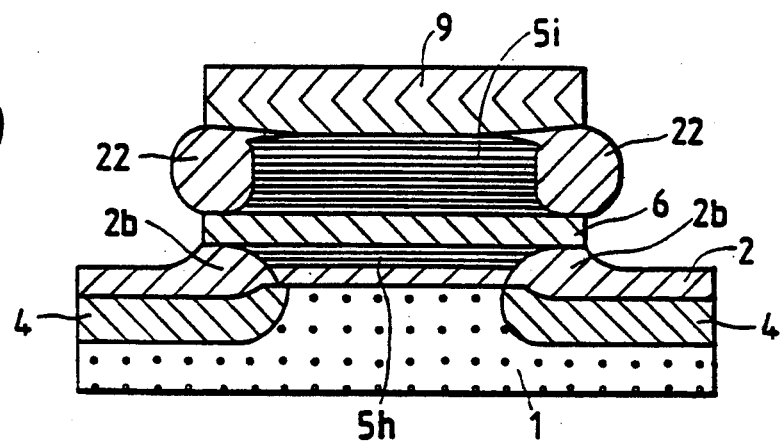
Figure 16C:
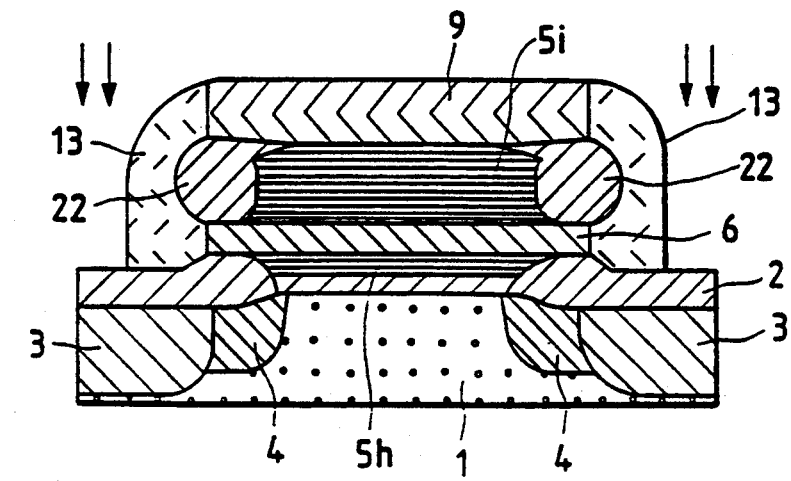

A fourth embodiment of a method of manufacture for a MOS FET according to the present invention will be described, whose objectives are to provide a method of manufacture for a MOS FET, having a basic configuration in accordance with the fourth embodiment of the present invention described above referring to FIG. 12, which can be easily adapted to current types of LSI manufacturing process. FIGS. 16(a) to 16(c) show successive steps in this method of manufacture, as cross-sectional views. In the step illustrated in FIG. 16(a), a Sio₂ insulating film 2 is formed on the upper face of a semiconductor substrate 1, a thin film of material (e.g. polysilicon formed to a thickness of 10 nm) suitable for constituting the lower layer 5h of a gate electrode is then formed on the SiO₂ insulating film 2, a layer of material suitable for constituting the central layer 6 of the gate electrode and which Is not readily oxidized is then formed thereon (e.g. a layer of tungsten formed to a depth of 100 nm), then a layer of material (e.g. polysilicon formed to a thickness of 10 nm) suitable for constituting the upper layer 5*i* of the gate electrode is then formed to a depth of 150 nm, and finally an insulating film 9 (for example an NST film 100 nm thick) is then formed on top. Anisotropic etching, after forming a photolithography mask, is then executed to form the gate electrode as a multilayer structure consisting of the layers 5*h*, 6, 5*i* and 9 on the $SiO_2$ insulating film 2 as shown in FIG. 16(*a*). Using than gate electrode structure as a mask, large tilt angle ion implantation of P ions is then executed, to produce a dopant concentration of $4 \times 10^{13}$ cm$^{-2}$ for forming the n-type lightly doped diffusion regions 4 within the upper surface of the semiconductor substrate 1, such that each of these diffusion regions extends to a sufficient distance below the multi-layer gate electrode structure.

In FIG. 16(*b*), oxidation processing is executed such as to oxidize both of the end portions of the gate electrode layer 5*h*, below the layer 6, for thereby producing thick portions 2*b* of the $SiO_2$ insulating film 2 positioned between the layer 6 and the diffusion regions 4, where these mutually overlap in the horizontal direction. In addition, oxidation is executed of the (vertical) side faces of the layer 5*i* of the gate electrode, above the layer 6, to form oxide portions 22, so that the top side of the multi-layer gate electrode structure is formed with an upwardly protruding convex shape, and the gate electrode thereby formed into the shape of a cross, as seen in cross-sectional view.

In FIG. 16(*c*), an HTO insulating film 13 is formed overall, then strongly anisotropic etching is executed in the vertical direction to selectively remove the HTO film 13, to leave that film remaining only on the (vertical) sides of the multi-layer gate electrode. Following that, ion implantation of As ions to a doping concentration of $4 \times 10^{15}$ cm$^{-2}$ is executed, to form the n-type highly doped diffusion regions 3 in the semiconductor substrate 1.

As for the preceding embodiments of methods of manufacturing MOS FETs according to the present invention, the fourth method embodiment described above embodiment can be easily realized by current types of LSI manufacturing technology, and this embodiment enables MOS FETs having the structure of the fourth device embodiment of the present invention to be produced by effectively using self alignment and without requiring a large number of processing steps.

The advantages provided by the present invention can be summarized as follows:

(1) With an MOS FET according to the present invention, a substantial reduction of stray capacitance between drain and gate can be achieved by comparison with comparable transistor structures of the prior art, without a reduction of device drive capabilities.

(2) The electric field strength in the vertical direction and amount of energy band curvature within the lightly doped drain diffusion region is reduced, thereby reducing the level of gate diode leakage current.

(3) The peak level of electric field within the lightly doped drain diffusion region is reduced, thereby alleviating the problems of device degradation etc. which result from hot-electron emission.

What is claimed is:

1. A method of manufacture of a metal-oxide semiconductor field effect transistor comprising successively executed steps of:

(a) forming upon a major face of a semiconductor substrate (1) that is of a first conduction type a first insulating film (2) and forming upon said first insulating film a second insulating film (10);

(b) forming a patterned mask (11) by photolithography at positions on the second insulating film, and executing anisotropic etching through the mask in a vertical direction to a depth sufficient to expose the first insulating film, for thereby forming an opening in the second insulating film;

(c) forming over regions including said opening in the second insulating film an upper film (12) having an etching ratio that is different from those of said first and second insulating films;

(d) executing anisotropic etching in the vertical direction to remove said upper film from positions other than side faces of said second insulating film;

(e) executing anisotropic etching in the vertical direction of the first insulating film using said second insulating film and said upper film as a mask, to thereby form an opening in said first insulating film which is concentric with and smaller than said opening in the second insulating film;

(f) executing oxidation of a region including said opening in the second insulating film, to form a region of the first insulating film on said major face of said substrate within said opening in the first insulating film;

(g) filling said openings in the first and second insulating films with a conducting material to form a gate electrode;

(h) executing etching to completely remove said second insulating film;

(i) executing slant angle ion implantation to form lightly doped first and second diffusion regions of a second conduction type, mutually opposing within said major face of the semiconductor substrate, said first and second lightly doped diffusion regions each extending to respective positions below said region of the first insulating film;

(j) forming a third insulating film over a region including said gate electrode;

(k) executing anisotropic etching in the vertical direction of the third insulating film, leaving the third insulating film remaining only on side faces of said gate electrode; and (l) executing ion implantation into said major face of the semiconductor substrate, to form first and second highly doped diffusion regions of the second conduction type, respectively adjoining said first and second lightly doped diffusion regions, wherein each of said highly doped diffusion regions is doped at a higher doping density than each of said lightly doped diffusion regions.

2. A method of manufacture of a metal-oxide semiconductor field effect transistor comprising successively executed steps of:

(a) forming upon a major face of a semiconductor substrate that is of a first conduction type a first insulating film, and successively forming upon said first insulating film as a multilayer set of films a first conducting film and a second conducting film, said second conducting film having an etching ratio that is different from said first conducting film;

(b) etching said multilayer set of films at positions using a photolithography mask, to a depth sufficient to expose said first insulating film, by anisotropic etching, to form a gate electrode from said multilayer set of films;

(c) etching mutually opposing end portions of said first conducting film of said gate electrode, while leaving said second conducting film of the gate electrode unchanged, to thereby form an underside of said gate electrode to a downwardly protruding convex shape;

(d) executing large slant angle ion implantation to form first and second lightly doped diffusion regions of a second conduction type in said major face of the semiconductor substrate, such that said diffusion regions extend to respective positions below said first conducting film of the gate electrode;

(e) executing reflow thermal processing to form a second insulating film of a material suitable for reflow processing, over a region including said gate electrode, with said second insulating film being formed to a greater thickness over said first insulating film than over a top face of said gate electrode;

(f) forming a third insulating film over said region including said gate electrode;

(g) executing etching to remove said third insulating film from all regions other than side portions of said second insulating film which cover side faces of said gate electrode, using anisotropic etching in a vertical direction; and (h) executing ion implantation to form first and second highly doped diffusion regions of the second conduction type, respectively adjoining said first and second lightly doped diffusion regions, in said major face of the semiconductor substrate, wherein each of said highly doped diffusion regions is doped at a higher doping density than each of said lightly doped diffusion regions.

3. A method of manufacture of a metal-oxide semiconductor field effect transistor comprising successively executed steps of:

(a) forming upon a major face of a semiconductor substrate that is of a first conduction type a first insulating film and successively forming upon said first insulating film as a multilayer set of films include a first conducting film (5d), a second conducting film (6) and a third conducting film (53), with said second conducting film having an etching ratio that is different from said first and said third conducting films;

(b) etching said multilayer set of films at positions using a photolithography mask, to a depth sufficient to expose said first insulating film, by anisotropic etching, to form a gate electrode from said multilayer set of films;

(c) etching mutually opposing end portions of said first conducting film and said third conducting films of said gate electrode while leaving said second conducting film of the gate electrode unchanged, to thereby form said gate electrode to a cross shape, by an isotropic etching process;

(d) executing slant angle ion implantation to form first and second lightly doped diffusion regions (4) of a second conduction type in said major face of the semiconductor substrate, such that said diffusion regions extend to respective positions below said first conducting film of the gate electrode;

(e) executing reflow thermal processing to form a second insulating film (7) of a material suitable for reflow processing, over a region including said gate electrode, with said second insulating film being formed to a greater thickness over said first insulating film than over a top face of said gate electrode;

(f) forming a third insulating film (8) over a region including said gate electrode;

(g) executing etching to remove said third insulating film from all regions other than side portions of said second insulating film which cover side faces of said gate electrode, using anisotropic etching in a vertical direction; and (h) executing ion implantation to form first and second highly dopes diffusion regions of the second conduction type, respectively adjoining said first and second lightly dopes diffusion regions (3), in said major face of the semiconductor substrate, wherein each of said highly doped diffusion regions is doped at a higher doping density than each of said lightly doped diffusion regions.

4. A method of manufacture of a metal-oxide semiconductor field effect transistor comprising successively executed steps of:

(a) forming upon a major fact of a semiconductor substrate (1) that is of a first conduction type a first insulating film (2), and successively forming upon said first insulating film as a multilayer set of films include a first conducting film and a second conducting film, with said second conducting film being formed of a material that is not readily oxidized;

(b) etching said multilayer set of films at positions using a photolithography mask and a anisotropic etching method, to a depth sufficient to expose said first insulating film, to form a gate electrode from said multilayer set of films;

(c) executing slant angle ion implantation to form first and second lightly doped diffusion regions of a second conduction type in said major face of the semiconductor substrate, such that said diffusion regions extend to respective positions below said first conducting film of the gate electrode;

(d) executing oxidation processing to oxidize opposing end portions of said first conducting film of the gate electrode while leaving said second conducting film unchange, to thereby form said gate electrode with an underside having a downwardly protruding convex shape;

(e) forming a second insulating film over a region including said gate electrode;

(f) executing anisotropic etching in a vertical direction, to remove said second insulating film from all regions other than side faces of said gate electrode; and (g) executing ion implantation to form first and second highly doped diffusion regions of the second conduction type, respectively adjoining said first and second lightly doped diffusion regions, in said major face of the semiconductor substrate, wherein each of said highly doped diffusion regions is doped at a higher doping density than each of said lightly doped diffusion regions.

5. A method of manufacture of a metal-oxide semiconductor field effect transistor comprising successively executed steps of:
   (a) forming upon a major face of a semiconductor substrate (1) that is of a first conduction type a first insulating film (2), and successively forming upon said first insulating film as a multilayer set of films include a first conducting film (5h), a second conducting film (6), a third conducting film (5i) and a second insulating film, with said second conducting film being formed of a material that is not readily oxidized;
   (b) etching said multilayer set of films at positions using a photolithography mask and a anisotropic etching method, to a depth sufficient to expose said first insulating film, to form a gate electrode from said multilayer set of films;
   (c) executing slant angle ion implantation to form first and second lightly doped diffusion regions (4) of a second conduction type in said major face of the semiconductor substrate, such that said diffusion regions extend to respective positions below said first conducting film of the gate electrode;
   (d) executing oxidation processing to oxidize opposing end portions of said first conducting film and said third conducting film of the gate electrode while leaving said second conducting film unchanged, to thereby form said gate electrode to the shape of a cross;
   (e) forming a third insulating film (13) over a region including said gate electrode;
   (f) executing anisotropic etching in a vertical direction, to remove said third insulating film from all regions other than said faces of said gate electrode; and
   (g) executing ion implantation to form first and second highly doped diffusion regions (e) of the second conduction type, respectively adjoining said first and second lightly doped diffusion regions, in said major face of the semiconductor substrate, wherein each of said highly doped diffusion regions is doped at a higher doping density than each of said lightly doped diffusion regions.

* * * * *